(12) United States Patent
Matsuoka

(10) Patent No.: US 8,269,313 B2
(45) Date of Patent: Sep. 18, 2012

(54) BIPOLAR TRANSISTOR INCLUDING CONDUCTIVE FIRST AND SECOND PROTECTION LAYERS

(75) Inventor: Akio Matsuoka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 183 days.

(21) Appl. No.: 12/662,148

(22) Filed: Apr. 1, 2010

(65) Prior Publication Data

US 2010/0258799 A1    Oct. 14, 2010

(30) Foreign Application Priority Data

Apr. 10, 2009  (JP) ................. 2009-096067

(51) Int. Cl.
H01L 27/082 (2006.01)
H01L 27/102 (2006.01)
H01L 29/70 (2006.01)
H01L 31/11 (2006.01)

(52) U.S. Cl. ........ 257/565; 257/571; 257/576; 257/586; 257/587; 257/E29.03; 257/E29.114; 257/E29.171; 257/E29.174

(58) Field of Classification Search .......... 257/565, 257/571, 576, 586, 587, E29.03, E29.114, 257/E29.171, E29.174
See application file for complete search history.

(56) References Cited

U.S. PATENT DOCUMENTS

| | | | | |
|---|---|---|---|---|
| 4,812,417 A | * | 3/1989 | Hirao | 438/362 |
| 4,860,085 A | * | 8/1989 | Feygenson | 257/513 |
| 4,889,823 A | * | 12/1989 | Bertagnolli et al. | 438/367 |
| 5,434,092 A | * | 7/1995 | Neudeck et al. | 438/341 |
| 5,480,815 A | * | 1/1996 | Watanabe | 438/365 |
| 5,480,816 A | * | 1/1996 | Uga et al. | 438/309 |
| 5,496,745 A | * | 3/1996 | Ryum et al. | 438/359 |
| 5,591,651 A | * | 1/1997 | Chen | 438/362 |
| 5,656,514 A | * | 8/1997 | Ahlgren et al. | 438/320 |
| 5,773,349 A | * | 6/1998 | Ham | 438/348 |
| 5,789,800 A | * | 8/1998 | Kohno | 257/588 |
| 6,114,744 A | * | 9/2000 | Kawaguchi et al. | 257/587 |
| 6,156,594 A | * | 12/2000 | Gris | 438/202 |
| 6,559,020 B1 | * | 5/2003 | Salmi | 438/312 |
| 6,686,250 B1 | * | 2/2004 | Kalnitsky et al. | 438/345 |

(Continued)

FOREIGN PATENT DOCUMENTS

JP       6-53229 A    2/1994

(Continued)

OTHER PUBLICATIONS

Tak H. Ning and Randall D. Isaac, "Effect of Emitter Contact on Current Gain of Silicon Bipolar Devices", IEEE Transactions on Electron Devices, Nov. 1980, ED-27, No. 11, pp. 2051-2055.

*Primary Examiner* — Ida M Soward

(74) *Attorney, Agent, or Firm* — McGinn IP Law Group, PLLC

(57) ABSTRACT

A bipolar transistor at least includes a semiconductor substrate including an $N^-$ epitaxial growth layer and a $P^-$ silicon substrate, an $N^+$ polysilicon layer, a tungsten layer, two silicide layers, a base electrode, an emitter electrode, and a collector electrode. The $N^+$ polysilicon layer formed on the semiconductor substrate is covered with one of the silicide layers. The tungsten layer that is formed on the silicide layer is covered with the other silicide layer.

11 Claims, 38 Drawing Sheets

U.S. PATENT DOCUMENTS

| | | | |
|---|---|---|---|
| 7,008,851 B2 * | 3/2006 | Johansson et al. | 438/309 |
| 7,425,754 B2 * | 9/2008 | Akatsu et al. | 257/565 |
| 7,491,617 B2 * | 2/2009 | Greenberg et al. | 438/345 |
| 7,855,404 B2 * | 12/2010 | Heinenman et al. | 257/274 |
| 7,935,986 B2 * | 5/2011 | Khater | 257/198 |
| 8,008,720 B2 * | 8/2011 | Davies | 257/341 |
| 2004/0256635 A1 * | 12/2004 | Saitoh et al. | 257/197 |
| 2005/0082642 A1 * | 4/2005 | Freeman et al. | 257/565 |
| 2005/0121748 A1 * | 6/2005 | Ahlgren et al. | 257/565 |
| 2007/0013033 A1 * | 1/2007 | Hayasi | 257/575 |

FOREIGN PATENT DOCUMENTS

| | | |
|---|---|---|
| JP | 2002-43321 A | 2/2002 |

\* cited by examiner

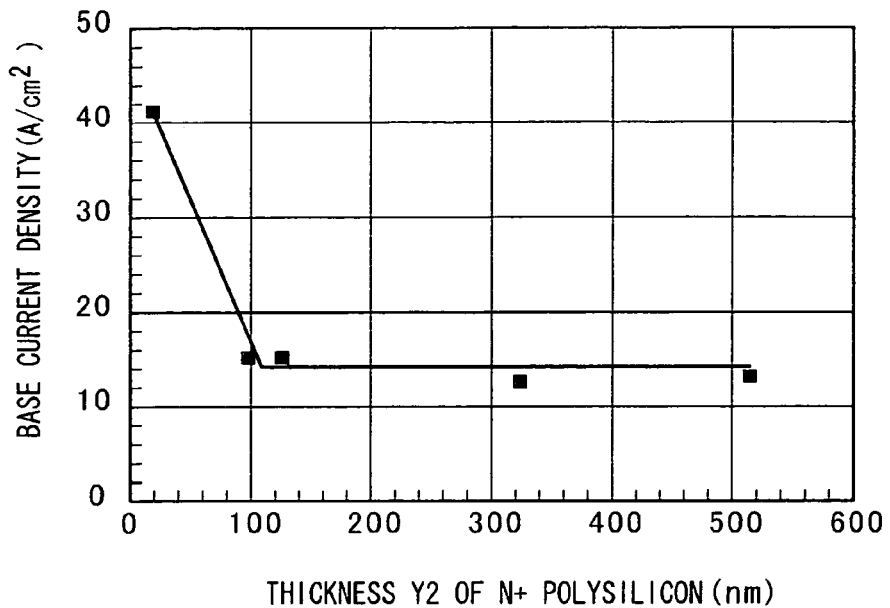
Fig. 16  RELATED ART
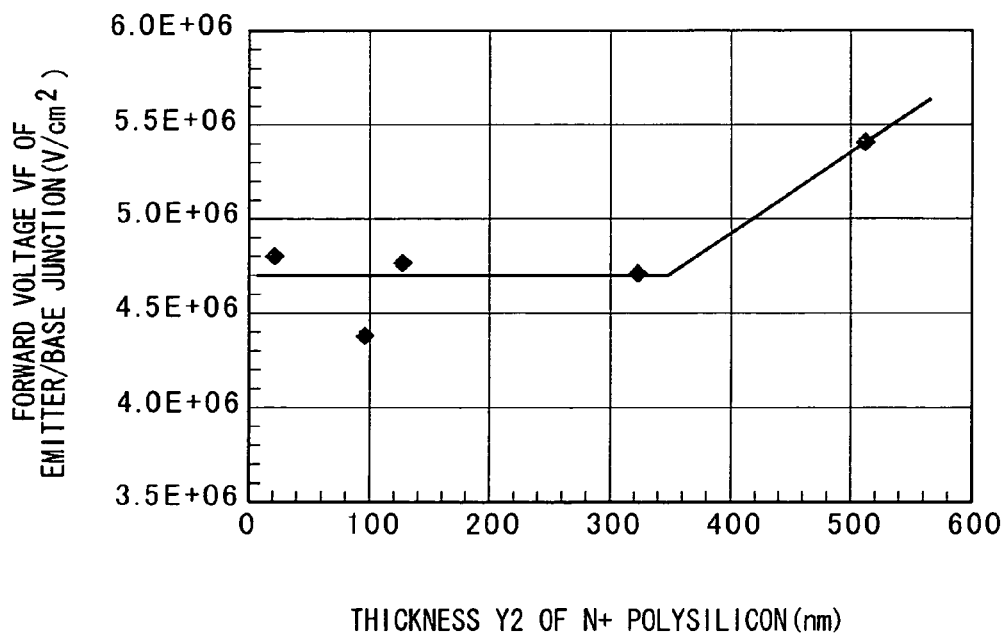
Fig. 17  RELATED ART

BIPOLAR TRANSISTOR INCLUDING CONDUCTIVE FIRST AND SECOND PROTECTION LAYERS

INCORPORATION BY REFERENCE

This application is based upon and claims the benefit of priority from Japanese patent application No. 2009-96067, filed on Apr. 10, 2009, the disclosure of which is incorporated herein in its entirety by reference.

BACKGROUND

1. Field of the Invention

The present invention relates to a bipolar transistor.

2. Description of Related Art

It is reported in an article by TAK. H. NING, RANDALL D. ISAAC, titled "Effect of Emitter Contact on Current Gain of Silicon Bipolar Devices", IEEE Transactions on Electron Devices, November 1980, ED-27, No. 11, p 2051-2055 that change of a thickness of an emitter polysilicon changes a common emitter direct current amplification ratio (hereinafter abbreviated as hFE) in a non self-aligned homojunction bipolar transistor. More specifically, when the thickness of the emitter polysilicon is small, the ratio that holes flowing from a base to an emitter recombine with electrons decreases. Thus, a base current (hereinafter abbreviated as Ib) increases. However, there is no change in a collector current (hereinafter abbreviated as Ic). Further, as hFE=Ic/Ib is established, hFE decreases. If the emitter polysilicon has a large thickness to some extent, the ratio that the holes flowing from the base to the emitter recombine with the electrons increases. Thus, Ib becomes substantially constant. Thus, hFE becomes constant. Hence, a lower limit value of the thickness of the emitter polysilicon that is required to make hFE constant can be determined.

While the thickness of the emitter polysilicon increases, high-frequency property is degraded. For example, description will be made on cutoff frequency (hereinafter abbreviated as fT) which is the typical high-frequency property. According to an article by S. M. Sze, titled "Physics of Semiconductor Devices 2nd Edition", John Wiley & Sons, Inc., 1981, p 158, fT is expressed by the following expressions (1) to (3).

$$fT = 1/(2\pi \tau ec) \tag{1}$$

$$\tau ec = \tau E + \tau B + \tau C1 + \tau C2 \tag{2}$$

$$\tau E = rE \cdot (CE + CC + CP) \tag{3}$$

The main signals are as follows. τec indicates a total delay time. τE indicates a charging time of an emitter junction capacitance. τB indicates a charging time of a base. τC1 indicates a transport time through a collector depletion layer. τC2 indicates a collector junction charging time. rE indicates an emitter resistance. CE indicates emitter-base junction capacitance. CC indicates a base-collector junction capacitance. CP indicates other parasitic capacitance.

It is understood from the expressions (1) to (3) that, when the thickness of the emitter polysilicon becomes larger, rE increases and fT decreases. Accordingly, the upper limit value of the thickness of the emitter polysilicon can be determined from the value of rE and the property specification of the bipolar transistor.

Next, description will be made on bipolar transistors disclosed in Japanese Unexamined Patent Application Publication No. 2002-43321 and Japanese Unexamined Patent Application Publication No. 6-53229 as specific examples of the bipolar transistor. First, the structure of the bipolar transistor disclosed in Japanese Unexamined Patent Application Publication No. 2002-43321 will be described. FIG. 12 is a cross sectional view of the bipolar transistor disclosed in Japanese Unexamined Patent Application Publication No. 2002-43321. This bipolar transistor includes a base part, an emitter part, and a collector part.

In this bipolar transistor, as shown in FIG. 12, an N$^+$ buried layer 102 is formed on a P$^-$ silicon substrate 101. An N$^-$ epitaxial growth layer 103 having a resistance ratio of 1 to 5 Ω·cm, and a thickness of 0.7 to 2.0 μm, and a recess field oxide silicon layer 104 are formed thereon, for example. Further, an interlayer insulation film 112 is formed thereon.

In the base part, a graft base region 108 and a base silicide layer 111*a* are formed in a part of the N$^-$ epitaxial growth layer 103. Further, a base electrode 114*a* that contacts with the base silicide layer 111*a* is formed by penetrating the interlayer insulation film 112.

In the emitter part, a P$^+$ base region 105 and an N$^+$ emitter region 109 are formed in a part of the N$^-$ epitaxial growth layer 103. An emitter part polysilicon layer 106 is formed thereon, and a side-wall oxide silicon layer 110 is formed outside thereof. In the upper part of the emitter part polysilicon layer 106, an emitter silicide layer 111*b* is formed. Further, an emitter electrode 114*b* that contacts with the emitter silicide layer 111*b* is formed by penetrating the interlayer insulation film 112.

In the collector part, a collector lead-out region 107 and a collector silicide layer 111*c* are formed on the N$^+$ buried layer 102. Further, a collector electrode 114*c* that contacts with the collector silicide layer 111*c* is formed by penetrating the interlayer insulation film 112.

Next, a manufacturing method of this bipolar transistor will be described. FIGS. 13A to 13C are cross sectional views showing the manufacturing processes of the bipolar transistor. First, as shown in FIG. 13A, the N$^+$ buried layer 102 is formed on the P$^-$ silicon substrate 101. Subsequently, the N$^-$ epitaxial growth layer 103 is grown thereon. Then, the recess field oxide silicon layer 104 is formed by thermal oxidation.

Next, as shown in FIG. 13B, after implanting phosphorus, thermal treatment is performed, so as to form the collector lead-out region 107. Subsequently, the P$^+$ base region 105 is formed.

Next, polysilicon is deposited to have a thickness of 100 to 150 nm, and thereafter As ion is implanted. Thereafter, dry etching is performed using the resist as a mask, so as to form the emitter part polysilicon layer 106.

Further, BF$_2$ ion is implanted using the emitter part polysilicon layer 106 as a mask. Subsequently, annealing is performed with an annealing temperature of 1000 to 1100° C. for 5 to 30 seconds. Thus, the graft base region 108 is formed, and As in the emitter part polysilicon layer 106 is diffused into the P$^+$ base region 105, so as to form the N$^+$ emitter region 109.

Next, the oxide silicon film is laminated by a CVD (Chemical Vapor Deposition) method. This oxide silicon film is shaped by dry etching, so as to form the side-wall oxide silicon layer 110.

Next, by sputtering, a refractory metal such as titanium is deposited. Subsequently, sintering is performed with a sintering temperature of 500 to 700° C. for 10 to 30 minutes, and makes the refractory metal react with the emitter part polysilicon layer 106, the graft base region 108, and the collector lead-out region 107, so as to form the base silicide layer 111*a*, the emitter silicide layer 111*b*, and the collector silicide layer 111*c*. The unreacted refractory metal is removed by wet etching.

Then, as shown in FIG. 13C, the interlayer insulation film 112 below the first-layer aluminium wiring (not shown) is formed, and the surface is planarized. Thereafter, a base contact opening 113a, an emitter contact opening 113b, and a collector contact opening 113c are formed.

Next, the base electrode 114a, the emitter electrode 114b, and the collector electrode 114c are formed, and the bipolar transistor as shown in FIG. 12 is thus manufactured.

Next, the structure of the bipolar transistor disclosed in Japanese Unexamined Patent Application Publication No. 6-53229 will be described. FIG. 14 is a cross sectional view of the bipolar transistor disclosed in Japanese Unexamined Patent Application Publication No. 6-53229. As shown in FIG. 14, this bipolar transistor has an $N^+$ buried layer 202 formed on a $P^-$ silicon substrate 201. An $N^-$ epitaxial growth layer 203 and an element isolation oxide film 204 are formed thereon. Further, a $P^+$ base region 206 and an intrinsic base 209 are formed on the $N^-$ epitaxial growth layer 203. An $N^+$ emitter region 211 is formed in a part of the intrinsic base 209.

A $P^+$ polysilicon 205 is formed on the element isolation oxide film 204 and the $P^+$ base region 206. An $N^+$ polysilicon layer 212 is formed on the $N^+$ emitter region 211. Further, a polysilicon layer 210 is formed to contact with the $N^+$ polysilicon layer 212, and an oxide film 207 is further formed outside thereof. A nitride film 208 is formed in a part on the oxide film 207.

Further, a tungsten layer 213 that covers the nitride film 208 and the $N^+$ polysilicon layer 212 is formed. Then, an oxide film 214 that covers the upper surface of the bipolar transistor is formed. Furthermore, an electrode 215 that contacts with the tungsten layer 213 is formed by penetrating the oxide film 214.

Next, a manufacturing method of the bipolar transistor will be described. FIGS. 15A to 15C are cross sectional views showing the manufacturing processes of the bipolar transistor. First, as shown in FIG. 15A, the $N^+$ buried layer 202 is formed on the $P^-$ silicon substrate 201. The $N^-$ epitaxial growth layer 203 is grown thereon. Subsequently, the element isolation oxide film 204 is formed.

Next, the $P^+$ polysilicon 205 is formed. After that, thermal treatment is performed, so as to diffuse P impurities in the $P^+$ polysilicon 205 into the $N^-$ epitaxial growth layer 203 and form the $P^+$ base region 206. Further, by the CVD method and anisotropic dry etching, the oxide film 207 and the nitride film 208 are formed, and the $N^-$ epitaxial growth layer 203 is exposed. Then, treatment is performed in gas atmosphere including P doping gas, so as to form the intrinsic base 209 in a part where the $N^-$ epitaxial growth layer 203 is exposed.

Next, as shown in FIG. 15B, oxide film etching, polysilicon depositing, and anisotropic dry etching are performed, so as to form the polysilicon layer 210. Subsequently, treatment is performed in the gas atmosphere including N doping gas, and thus the $N^+$ emitter region 211 is formed in a part where the intrinsic base 209 is exposed.

Next, as shown in FIG. 15C, the $N^+$ polysilicon layer 212 having a thickness of about 100 nm is formed using gas including N doping gas. Subsequently, the tungsten layer 213 is formed by selective growth. Then, the oxide film 214 is formed on the tungsten layer 213. Thereafter, by a known method, the oxide film 214 is opened to form the electrode 215, so as to obtain the bipolar transistor shown in FIG. 14.

SUMMARY

The present inventors have conducted the following experiment to determine the appropriate range of the thickness of the emitter part polysilicon layer. First, in order to know the lower limit of the thickness of the emitter part polysilicon layer, in the bipolar transistor of TAK. H. NING et al., the base current density is measured by varying the thickness of the emitter part polysilicon layer 106. FIG. 16 is a graph showing the experimental result, in which a horizontal axis shows the thickness Y2 of the emitter part polysilicon layer 106 just above the $N^+$ emitter region, and a longitudinal axis shows the base current density. As shown in FIG. 16, when Y2 is 100 nm or less, the base current density increases. In summary, as Ib increases, hFE is abruptly decreased. Thus, in order to keep hFE constant, Y2>100 nm needs to be satisfied.

Next, in order to know the upper limit of the thickness Y2 of the emitter part polysilicon layer 106, a relation between the thickness Y2 and the forward voltage (hereinafter abbreviated as VF) of the emitter-base junction is observed while keeping base forming condition constant and varying Y2. FIG. 17 is a graph showing the experimental result, in which a horizontal axis shows Y2, and a longitudinal axis shows VF when current of 20 mA is flowed while the emitter-base junction is forward biased. From the relation between VF and the current, a combined resistance value when the emitter resistance and the base resistance are directly connected can be estimated by Ohm's law. As shown in FIG. 17, VF starts to increase when Y2 exceeds 320 nm. The increase of VF means that the emitter resistance increases. Thus, from the expressions (1) to (3), fT is degraded. Thus, in order to obtain fine bipolar transistor characteristics, Y2<320 nm needs to be satisfied.

From the above description, the present inventors have estimated that the appropriate range of the thickness Y2 of the emitter polysilicon is 100 nm<Y2<320 nm.

However, in the bipolar transistor disclosed in Japanese Unexamined Patent Application Publication No. 2002-43321, the actual value of the thickness Y2 of the emitter part polysilicon layer 106 shown in FIG. 12 is unknown. It is described in Japanese Unexamined Patent Application Publication No. 2002-43321 that Y2 is 100 to 150 nm. However, the composition and the thickness of the interlayer insulation film 112 and the thickness of the emitter silicide layer 111b are unknown.

In order to estimate the over-etched amount of the emitter part polysilicon layer 106 in the bipolar transistor disclosed in Japanese Unexamined Patent Application Publication No. 2002-43321, the present inventors have conducted the following experiment.

First, polysilicon is grown in a wafer in which the device pattern of the transistor is formed. After sputtering Ti by 32 to 38 nm on this polysilicon, sintering is performed with a sintering temperature of 650 to 750° C. for 20 to 60 seconds. The resultant thickness of the silicide layer that is formed here is 32 to 38 nm.

Next, a BPSG (Boro-Phospho Silicate Glass) layer of a plasma TEOS (TetraEthyl OrthoSilicate) is deposited. This is planarized by a CMP (Chemical Mechanical Polishing) method, thereafter the thickness of the BPSG layer is measured. The resultant thickness is 820 to 860 nm.

Next, as shown in FIG. 13C, taking forming of the emitter contact opening 113b into consideration, a multi-layer film of the BPSG layer of plasma TEOS (820 to 860 nm)/the silicide layer (32 to 38 nm)/the polysilicon layer (100 to 150 nm) is etched by dry etching. The BPSG layer and the silicide layer are removed, and the polysilicon layer is etched by 5 to 10 nm.

By applying this etching to the bipolar transistor structure disclosed in Japanese Unexamined Patent Application Publication No. 2002-43321, the thickness Y2 of the emitter part polysilicon layer 106 is estimated to be 100-10=90 nm at minimum, and 150-5=145 nm at maximum. Accordingly, 90 nm≦Y2≦145 nm is established, which means Y2 may be lower than 100 nm, which is the lower limit value of the thickness of the emitter polysilicon described with reference to FIG. 16. When Y2≦100 nm in the wafer surface and between wafers, the base current density increases. Accordingly, hFE decreases, and variation in the wafer surface and between wafers increases.

On the other hand, according to the bipolar transistor disclosed in Japanese Unexamined Patent Application Publication No. 6-53229, the thickness of the $N^+$ polysilicon layer 212 shown in FIG. 14 is about 100 nm. Therefore, the variation of hFE can be reduced. Further, in the manufacturing method of the bipolar transistor, the thickness of the polysilicon does not vary due to the processing in the later process.

However, in this bipolar transistor, the tungsten layer 213 is formed on the $N^+$ polysilicon layer 212. Normally, this tungsten layer 213 is cleaned several times with its surface exposed in the later process. The cleaning fluid that is typically employed includes $NH_4OH$ and $H_2O_2$, and thus the tungsten layer 213 is corroded as a result of contact with the cleaning fluid. The present inventors have observed the cross section of the tungsten layer that is made contact with the cleaning fluid, and then recognized that the surface of the tungsten layer is disappeared.

When a part of the tungsten layer 213 is disappeared, the resistance increases. Further, when the disappearance of the tungsten layer 213 is promoted and a void is created between the $N^+$ polysilicon layer 212 and the electrode 215, this part is electrically opened, which is a serious problem from a viewpoint of reliability.

A first exemplary aspect of the present invention is a bipolar transistor, including a semiconductor substrate that includes an epitaxial growth layer, a polysilicon layer that is formed on the semiconductor substrate, a conductive first protection layer that covers the polysilicon layer, a metal layer that is formed on the conductive first protection layer, a conductive second protection layer that covers the metal layer, and an emitter electrode that is formed on the conductive second protection layer.

A second exemplary aspect of the present invention is a method of manufacturing a bipolar transistor, including forming a polysilicon layer on a semiconductor substrate that includes an epitaxial growth layer, forming a conductive first protection layer that covers the polysilicon layer, forming a metal layer on the conductive first protection layer, forming a conductive second protection layer that covers the metal layer, and forming an emitter electrode on the conductive second protection layer.

According to the bipolar transistor and the manufacturing method of the bipolar transistor of the present invention, the polysilicon layer is protected by the conductive first protection layer. Hence, it is possible to prevent the polysilicon layer from being etched due to the influence of the later process, thereby preventing the thickness of the polysilicon layer from being reduced. Further, as the metal layer is protected by the conductive first protection layer and the conductive second protection layer, it is possible to prevent the metal layer from being corroded due to the influence of the later process. Therefore, it is possible to obtain the bipolar transistor having high reliability that makes it possible to reduce variation of hFE and prevent increase of the resistance.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 2I is a cross sectional view showing a manufacturing process of the bipolar transistor according to the first exemplary embodiment;

FIG. 2O is a cross sectional view showing a manufacturing process of the bipolar transistor according to the first exemplary embodiment;

FIG. 16 is a graph showing a relation between a thickness of an emitter part polysilicon layer and base current density; and FIG. 17 is a graph showing a relation between a thickness of an emitter part polysilicon layer and VF.

DETAILED DESCRIPTION OF THE EXEMPLARY EMBODIMENTS

Hereinafter, the exemplary embodiments of the present invention will be described with reference to the drawings.

First Exemplary Embodiment

Figure 1:
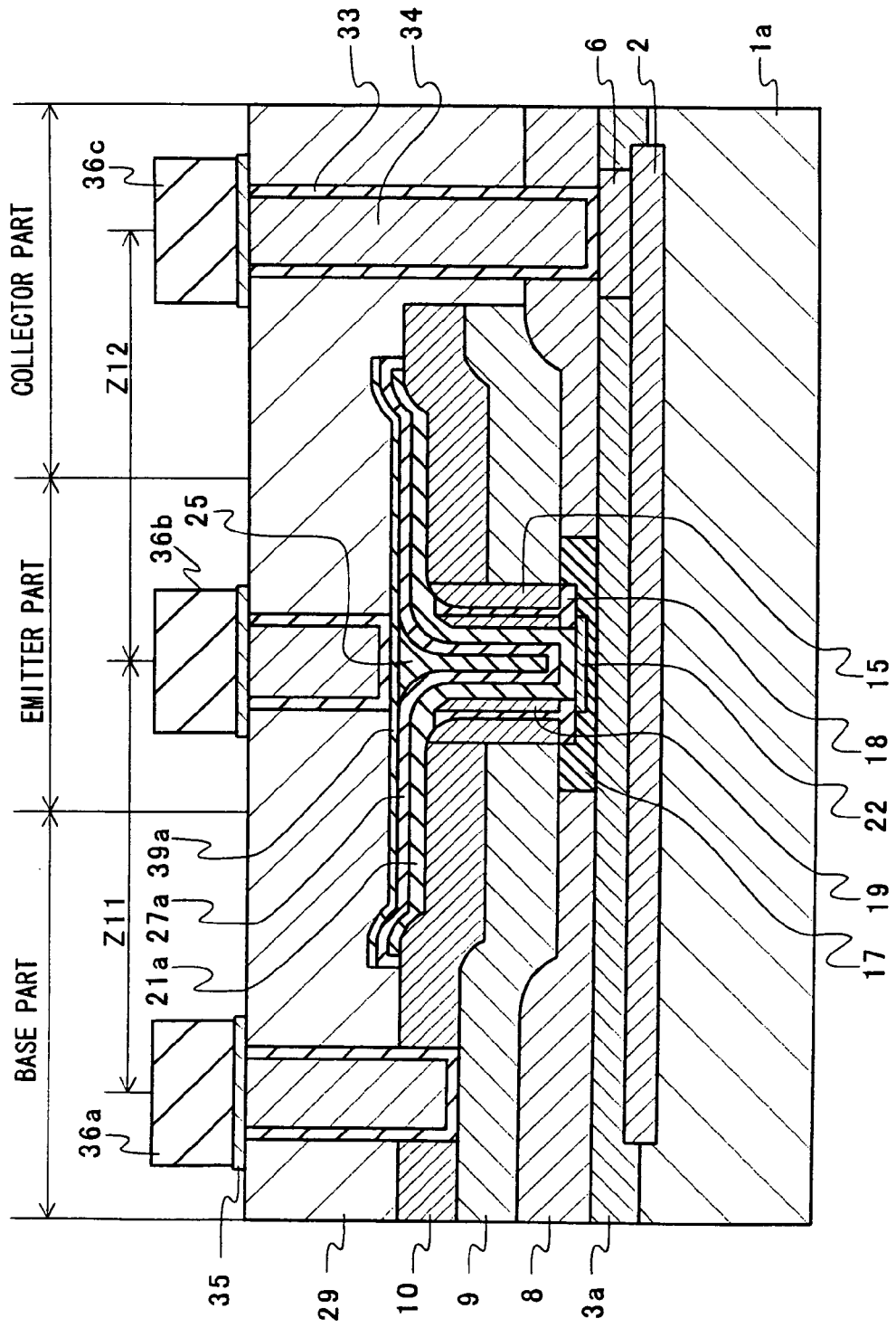
FIG. 1 is a cross sectional view of a bipolar transistor according to a first exemplary embodiment.

First, the structure of a bipolar transistor according to the first exemplary embodiment will be described. FIG. 1 is a cross sectional view of the bipolar transistor according to the first exemplary embodiment. As shown in FIG. 1, this bipolar transistor includes a base part, an emitter part, and a collector part.

This bipolar transistor includes an $N^+$ buried layer 2 and an $N^-$ epitaxial growth layer 3a having a resistance ratio of 0.2 to 0.8 $\Omega \cdot$cm and a thickness of 1 to 2 μm formed on a $P^-$ silicon substrate 1a. In a part of the $N^-$ epitaxial growth layer 3a, an $N^+$ lifting layer 6 that contacts with the $N^+$ buried layer 2 is formed.

An oxide silicon layer 8, a $P^+$ polysilicon layer 9, a nitride silicon layer 10, and an insulation layer 29 are formed thereon in this order.

In the base part, a tungsten layer 34 is formed to be covered with a barrier metal layer 33 that contacts with the $P^+$ polysilicon layer 9 by penetrating the insulation layer 29 and the nitride silicon layer 10. A barrier metal layer 35 and a base electrode 36a are formed thereon in this order.

In the emitter part, a part of the oxide silicon layer 8 is removed, and a B-doped SiGe layer 17 that contacts with the $N^-$ epitaxial growth layer 3a is formed. Further, in a part of the B-doped SiGe layer 17, an emitter diffusion layer 22 is formed. On the B-doped SiGe layer 17 and the emitter diffusion layer 22, a side-wall oxide silicon layer 18 is formed. A side-wall nitride silicon layer 15 is formed in the external part thereof and a side-wall nitride silicon layer 19 is formed in the internal part thereof.

Further, an $N^+$ polysilicon layer 21a is formed so as to contact with the emitter diffusion layer 22 by penetrating the side-wall oxide silicon layer 18 and extend on the nitride silicon layer 10. A silicide layer 27a that covers the $N^+$ polysilicon layer 21a is formed thereon. Then, a tungsten layer 25 is formed to fill an opening on the silicide layer 27a. Further, a silicide layer 39a is formed to cover the silicide layer 27a and the tungsten layer 25.

Further, the tungsten layer 34 is formed to be covered with the barrier metal layer 33 that contacts with the silicide layer 39a by penetrating the insulation layer 29. The barrier metal layer 35 and an emitter electrode 36b are formed in this order thereon.

In the collector part, the tungsten layer 34 is formed to be covered with the barrier metal layer 33 that contacts with the $N^+$ lifting layer 6 by penetrating the insulation layer 29 and the oxide silicon layer 8. The barrier metal layer 35 and a collector electrode 36c are formed thereon in this order.

Figure 2A:
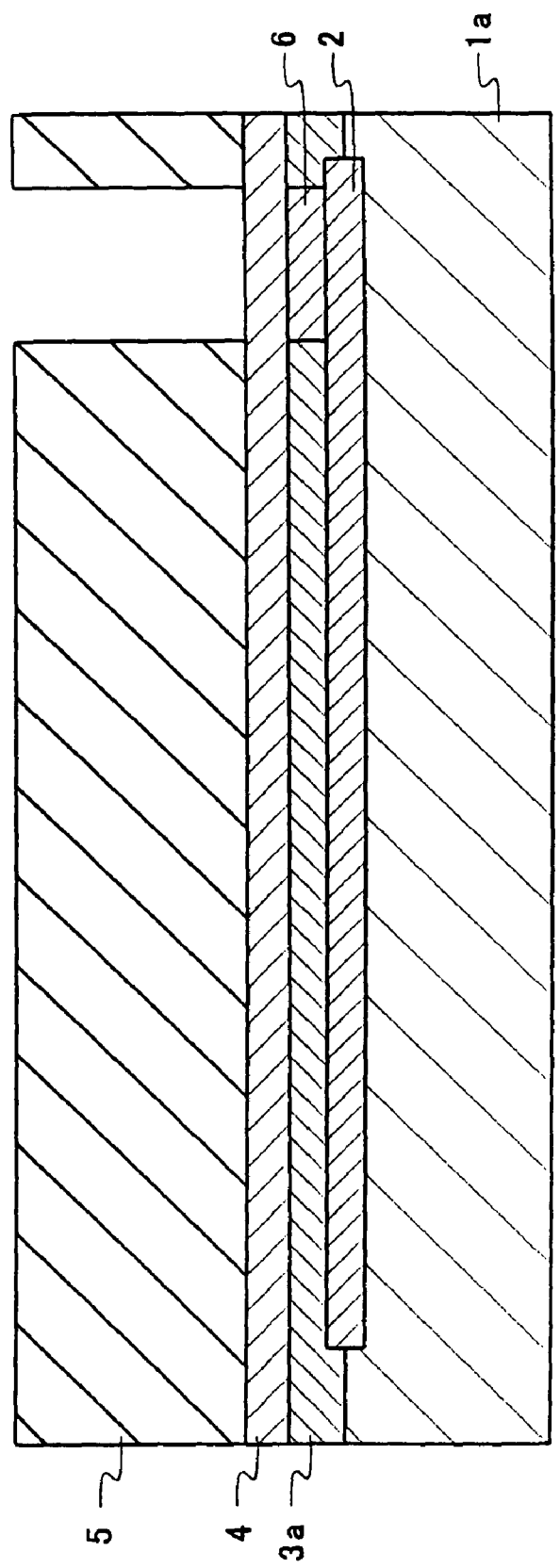
FIG. 2A is a cross sectional view showing a manufacturing process of the bipolar transistor according to the first exemplary embodiment.

Next, a manufacturing method of the bipolar transistor according to the first exemplary embodiment will be described. FIGS. 2A to 2R are cross sectional views showing manufacturing processes of the bipolar transistor according to the first exemplary embodiment. First, as shown in FIG. 2A, the $N^+$ buried layer 2 is formed on the $P^-$ silicon substrate 1a. Next, the $N^-$ epitaxial growth layer 3a is formed thereon. Then, an oxide silicon layer 4 is formed by thermal oxidation. Further, a resist 5 is formed by photolithography. Then, ion implantation is performed using the resist 5 as a mask, so as to form the $N^+$ lifting layer 6. The ion implantation is performed, for example, by implanting phosphorus with an energy of 60 to 90 keV, and a dosage of 1 E 15 to 1 E 16 cm$^{-2}$, and performing annealing with an annealing temperature of 900 to 950° C. for 10 to 30 minutes in the nitride atmosphere.

Figure 2B:
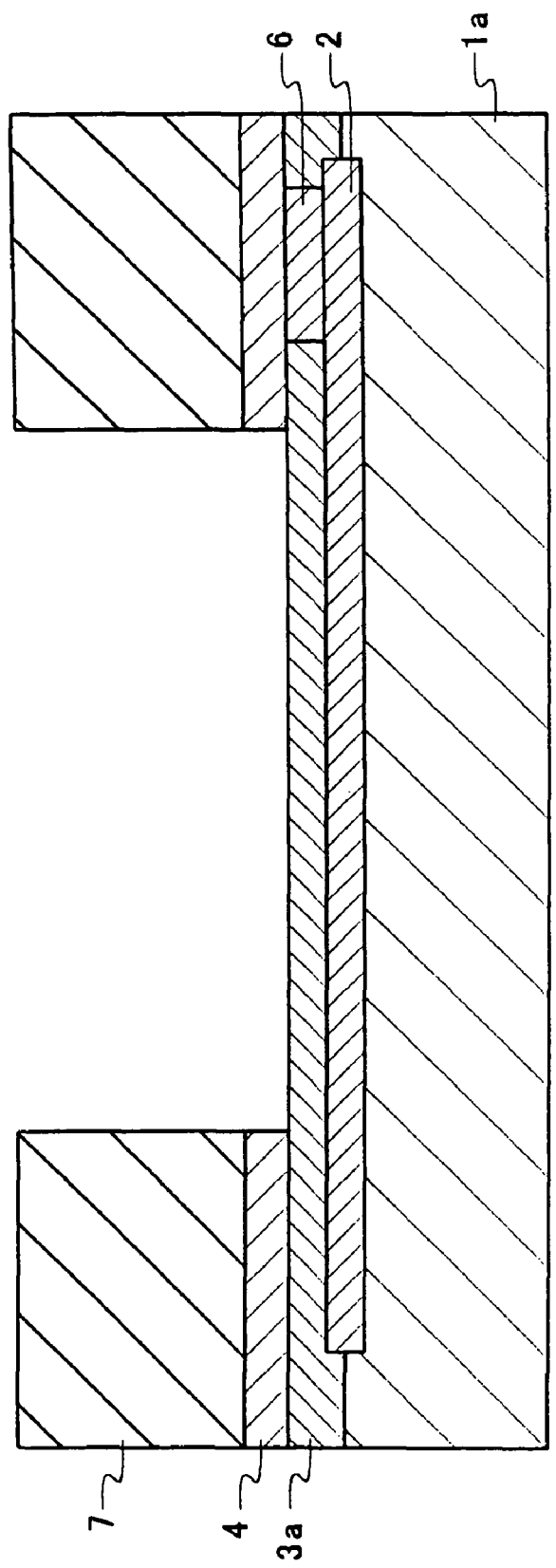
FIG. 2B is a cross sectional view showing a manufacturing process of the bipolar transistor according to the first exemplary embodiment.

Next, as shown in FIG. 2B, the resist 5 is removed, and thereafter a resist 7 is formed by photolithography. Then, the oxide silicon layer 4 is removed by wet etching, for example, using the resist 7 as a mask. A diluted hydrofluoric acid is used, for example, as an etchant.

Figure 2C:
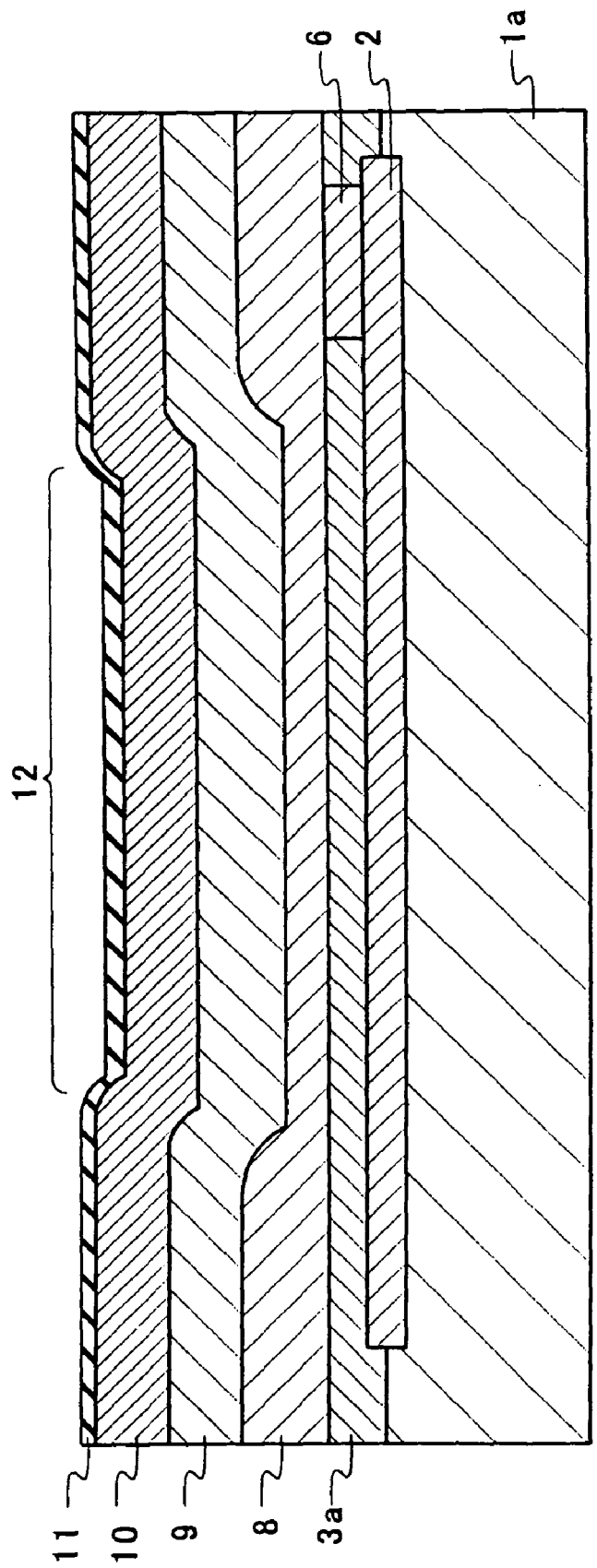
FIG. 2C is a cross sectional view showing a manufacturing process of the bipolar transistor according to the first exemplary embodiment.

Next, as shown in FIG. 2C, an oxide silicon is laminated on the oxide silicon layer 4 and the $N^-$ epitaxial growth layer 3a, so as to form the oxide silicon layer 8. Subsequently, polysilicon is deposited on the oxide silicon layer 8 by a low-pressure CVD method, for example, and thereafter boron ion is implanted, so as to form the $P^+$ polysilicon layer 9. The ion implantation is performed with an energy of 10 to 20 keV, and a dosage of 1E15 to 9E15 cm$^2$, for example. Further, by the low-pressure CVD method, for example, the nitride silicon layer 10 is deposited on the P+ polysilicon layer 9. Further, an oxide silicon layer 11 is deposited thereon by a CVD method, for example. As the thickness of the oxide silicon layer 8 is not even, there is produced a step part 12 in the center. The reason why the oxide silicon layer 8 is not even is that, in order to reduce the parasitic capacity on the P− silicon substrate 1a included in a metal wiring (not shown) that is eventually formed in this bipolar transistor, the thickness of the oxide silicon layer 8 in the region other than the step part 12 needs to be large.

Figure 2D:
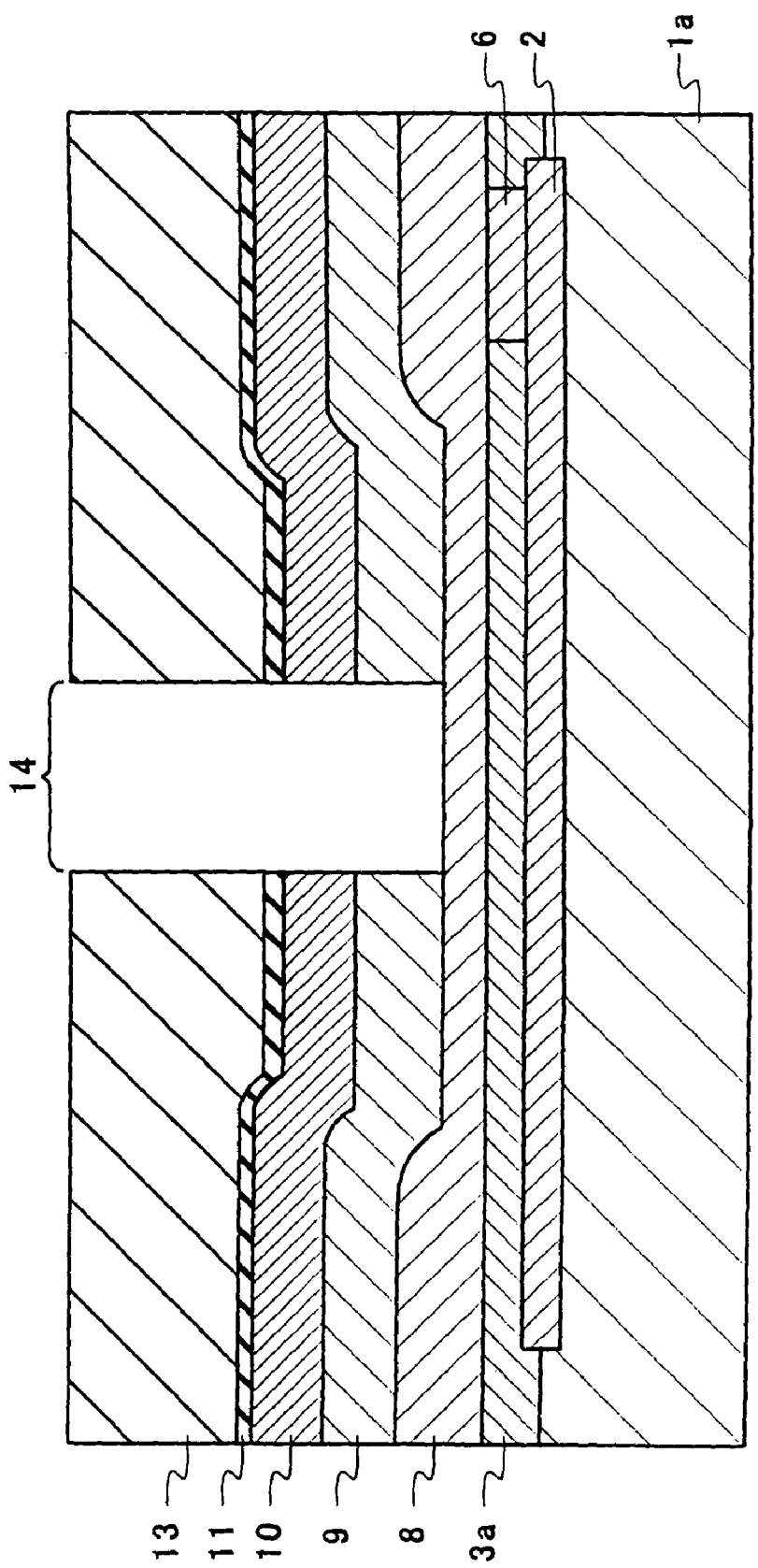
FIG. 2D is a cross sectional view showing a manufacturing process of the bipolar transistor according to the first exemplary embodiment.

Next, as shown in FIG. 2D, a resist 13 is formed by photolithography. An opening 14 is formed by anisotropic dry etching using the resist 13 as a mask.

Figure 2E:
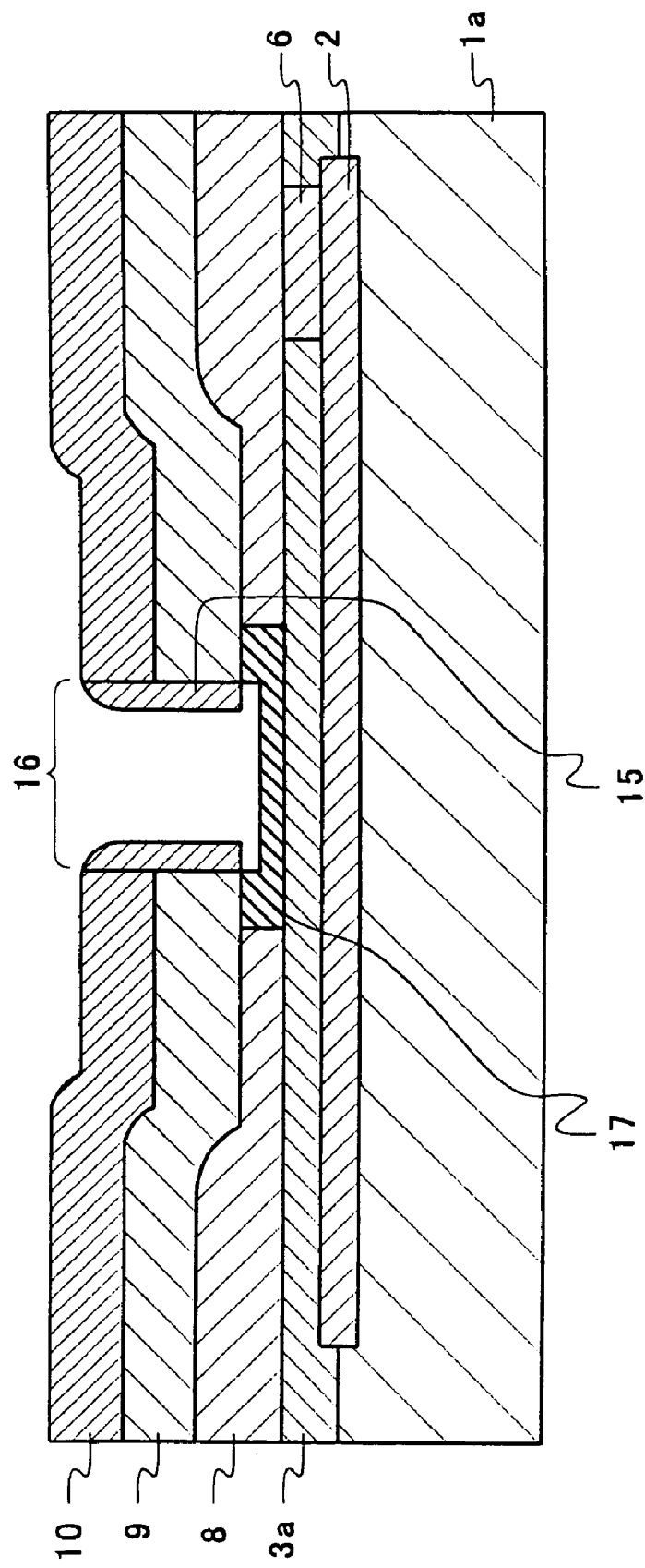
FIG. 2E is a cross sectional view showing a manufacturing process of the bipolar transistor according to the first exemplary embodiment.

Next, as shown in FIG. 2E, the resist 13 is removed, and thereafter a nitride silicon film (not shown) is laminated by the low-pressure CVD method, for example. After that, this nitride silicon film is etched back by anisotropic dry etching, so as to form the side-wall nitride silicon layer 15 in the opening 16. At this time, the oxide silicon layer 11 is removed.

Subsequently, the oxide silicon layer 8 that is exposed in a bottom part of the opening 16 is etched to be removed using hydrofluoric acid liquid, for example, so as to expose the surface of the N− epitaxial growth layer 3a. The etching time at this time is set so that etching is executed also in a lateral direction of the oxide silicon layer 8.

Next, the B-doped SiGe layer 17 is selectively laminated. The B-doped SiGe layer 17 is not laminated on the nitride silicon layer 10 and the side-wall nitride silicon layer 15, but is laminated on only a part in which the N− epitaxial growth layer 3a is exposed.

Figure 2F:
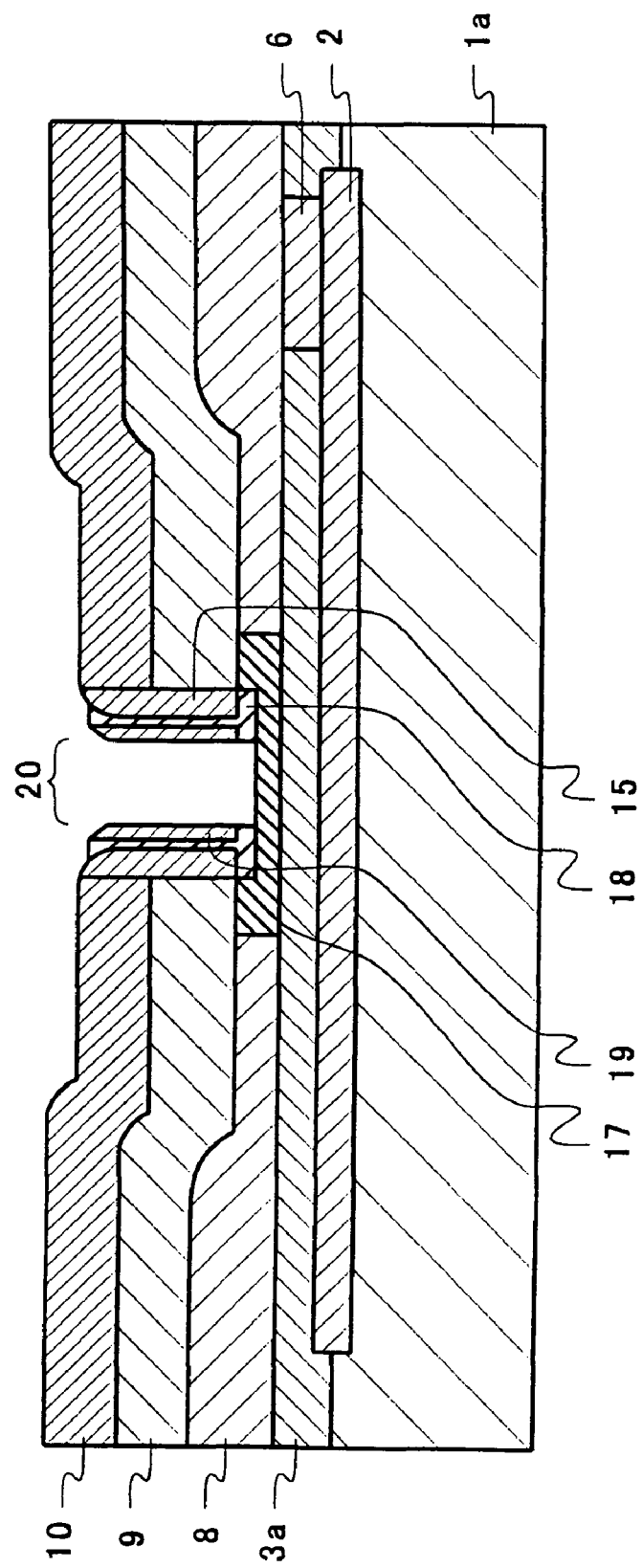
FIG. 2F is a cross sectional view showing a manufacturing process of the bipolar transistor according to the first exemplary embodiment.

Next, as shown in FIG. 2F, an oxide silicon film is laminated by the low-pressure CVD method, for example. Subsequently, a nitride silicon film is further laminated on the oxide silicon film. At this time, it is preferable that film-forming temperature of the nitride silicon film is as low as possible so as not to give any influence on the B-doped SiGe layer 17. In addition, the processing time is preferably as short as possible.

Then, the nitride silicon film is etched back by anisotropic dry etching. Next, for example, wet etching is performed with the hydrofluoric acid liquid, so as to remove the oxide silicon film. By these processes, the side-wall oxide silicon layer 18 and the side-wall nitride silicon layer 19 are formed in an opening 20. The aspect ratio of the opening 20 is 0.989.

Next, the side-wall oxide silicon layer 18 that is exposed in the bottom part of the opening 20 is removed by wet etching using the hydrofluoric acid liquid, so as to expose the B-doped SiGe layer 17.

Figure 2G:
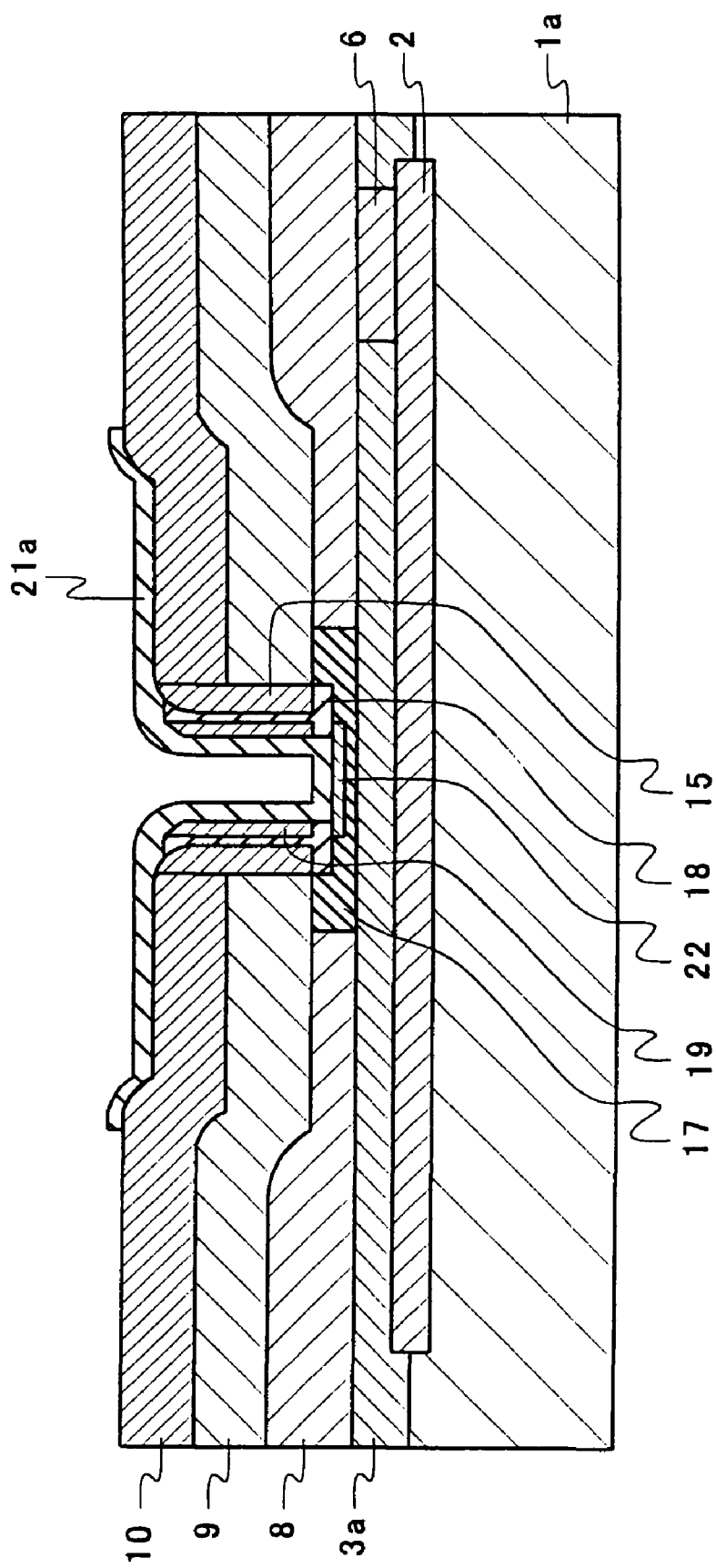
FIG. 2G is a cross sectional view showing a manufacturing process of the bipolar transistor according to the first exemplary embodiment.
Figure 3:
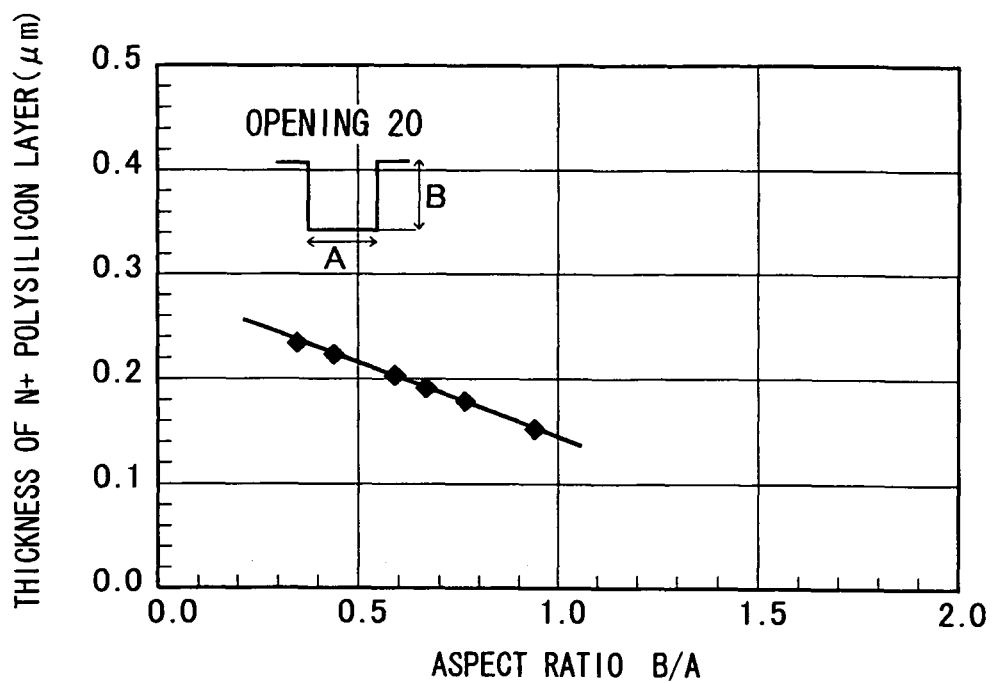
FIG. 3 is a graph showing a relation between an aspect ratio of an opening and a thickness of a polysilicon layer.

Next, as shown in FIG. 2G, polysilicon is deposited while doping As, so as to form the N+ polysilicon layer 21a. Now, a relation between the N+ polysilicon layer 21a and the aspect ratio of the opening 20 (depth/width of the opening, hereinafter the same) shown in FIG. 2F will be described. FIG. 3 shows a graph showing a relation between the aspect ratio of the opening 20 and the thickness of the N+ polysilicon layer 21a in the bottom part of the opening 20. As the aspect ratio of the opening 20 is 0.989, when polysilicon is grown by 108 to 132 nm, the thickness of the N+ polysilicon layer 21a in the bottom part of the opening 20 is 105 to 130 nm.

Subsequently, annealing is performed in the nitride atmosphere and As in the N+ polysilicon layer 21a is diffused into the B-doped SiGe layer 17, so as to form the emitter diffusion layer 22. In this example, lamp annealing is performed, for example, in order to make the emitter diffusion layer 22 shallow. The annealing is performed, for example, with an annealing temperature of 880 to 980° C. for 10 to 40 seconds.

Figure 2H:
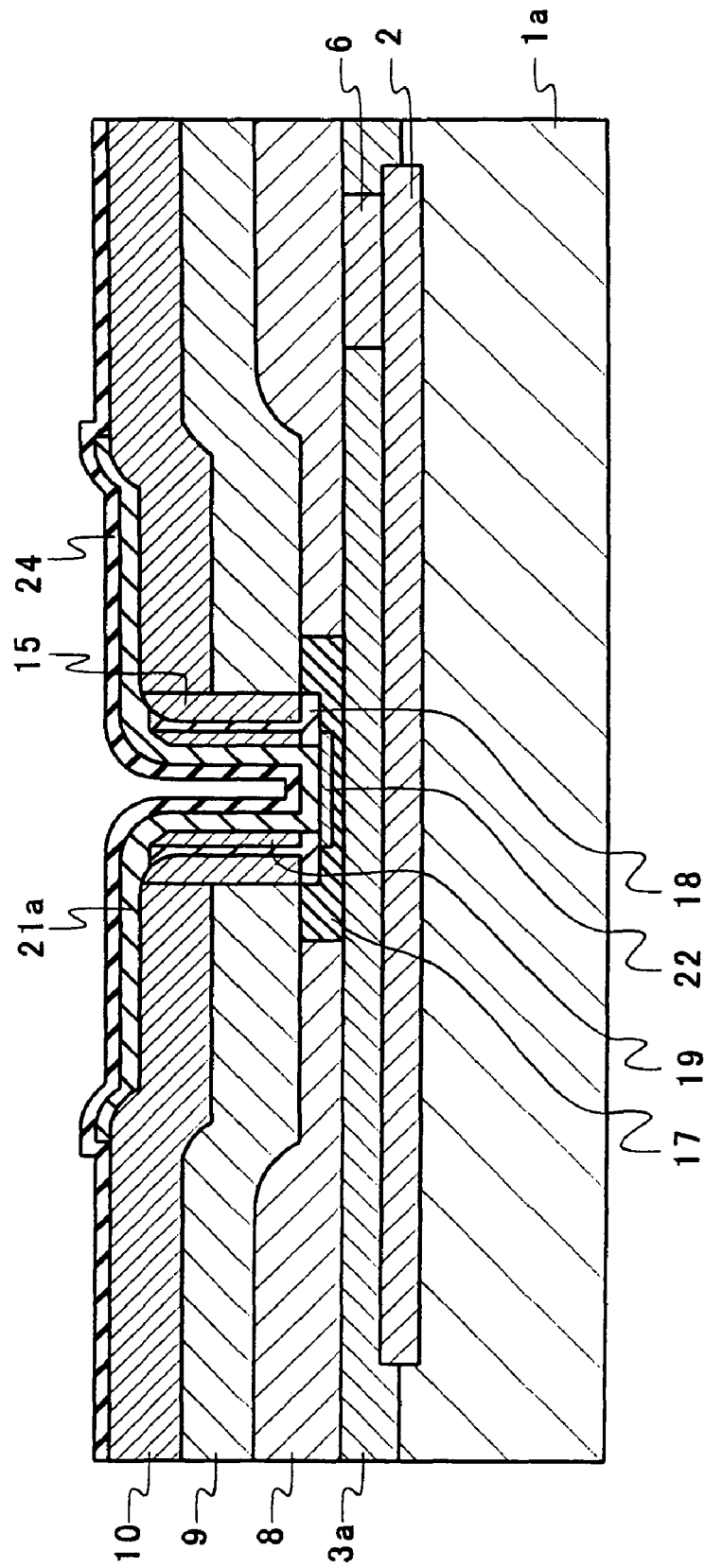
FIG. 2H is a cross sectional view showing a manufacturing process of the bipolar transistor according to the first exemplary embodiment.
Figure 21:
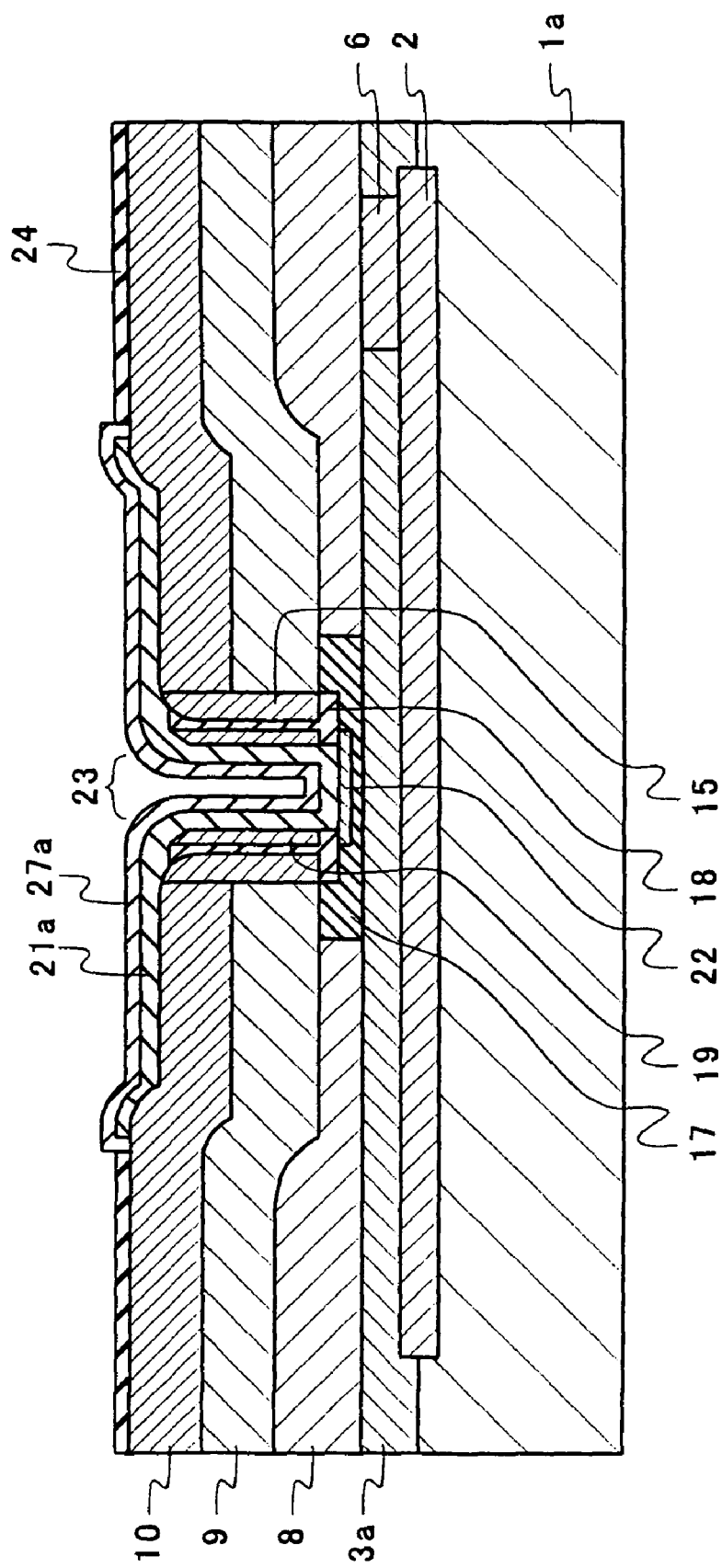

Next, as shown in FIG. 2H, a barrier metal layer 24 is laminated by sputtering, for example. The barrier metal layer 24 has a two-layer structure of TiN having a thickness of about 100 nm and Ti having a thickness of about 50 nm.

Next, as shown in FIG. 2I, sintering is performed, and the barrier metal layer 24 and the N+ polysilicon layer 21a are reacted, so as to form the silicide layer 27a. The sintering is performed for 20 to 60 seconds with a temperature of 650 to 750° C. The aspect ratio of an opening 23 is about 1.8.

Figure 2J:
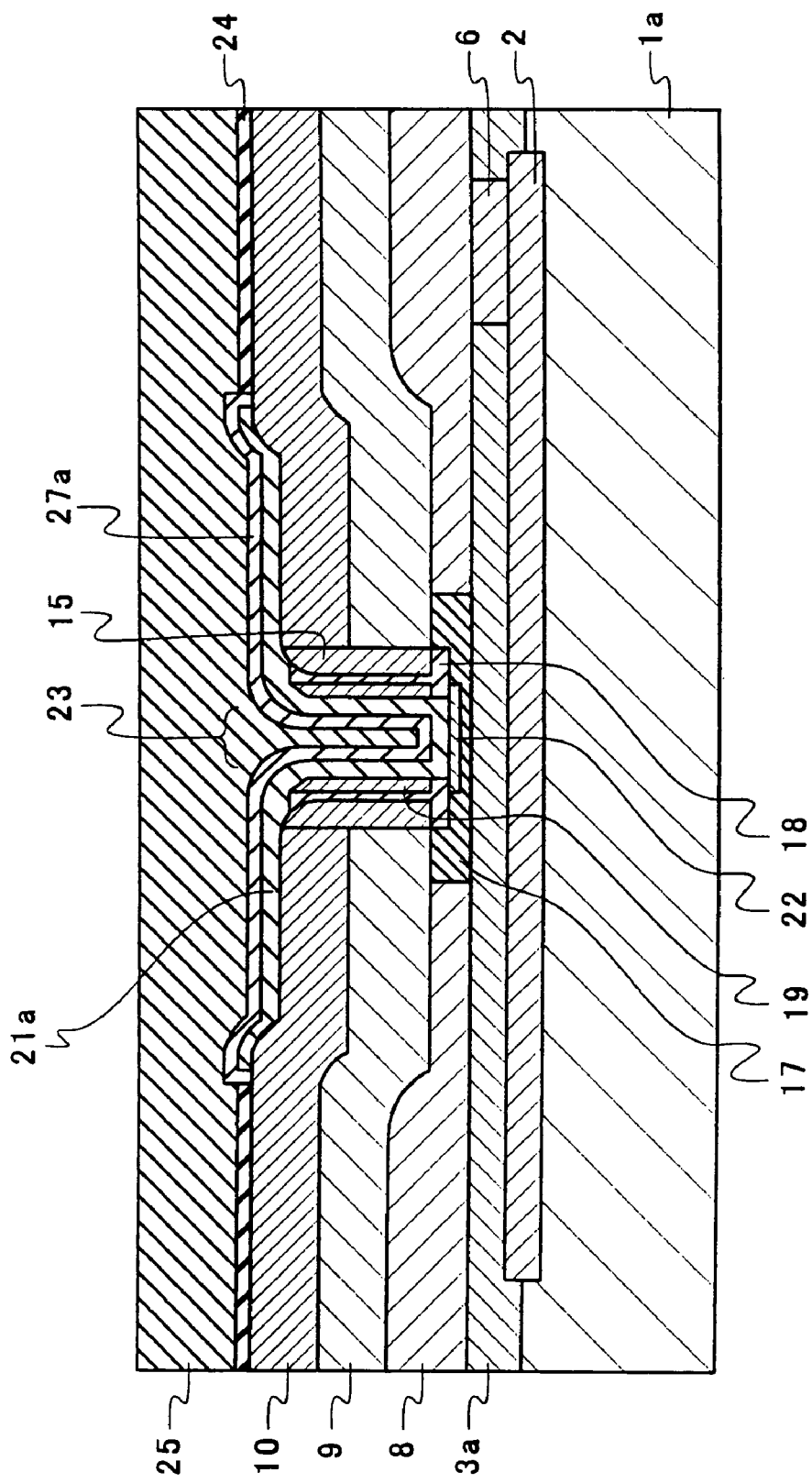
FIG. 2J is a cross sectional view showing a manufacturing process of the bipolar transistor according to the first exemplary embodiment.
Figure 4:
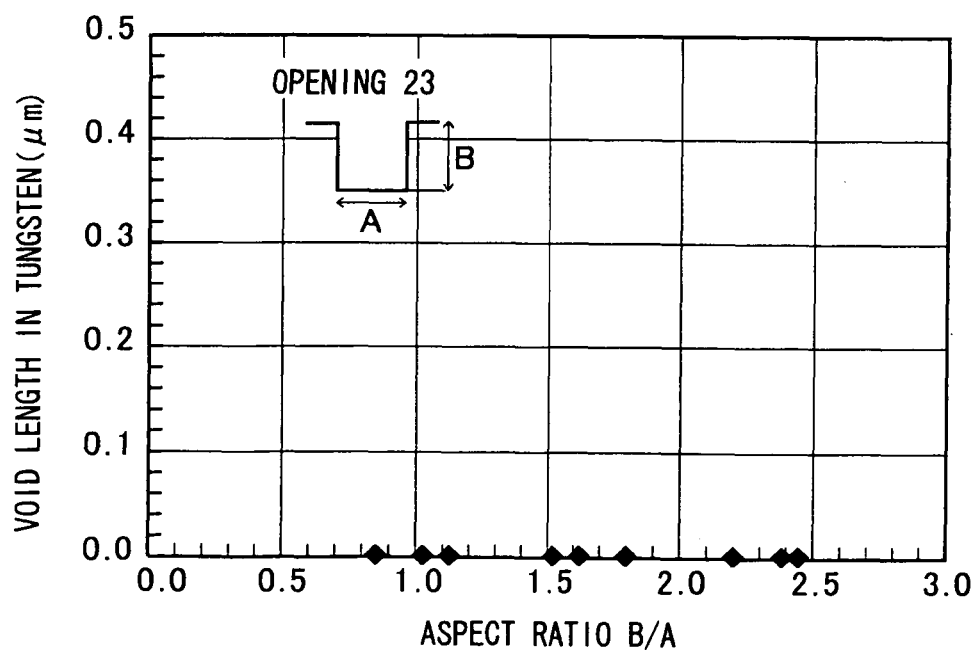
FIG. 4 is a graph showing a relation between an aspect ratio of an opening and a void length of a tungsten layer.

Next, as shown in FIG. 2J, the tungsten layer 25 is deposited. In this case, depending on the aspect ratio of the opening 23, there may be produced a void in the tungsten layer 25 that fills the opening 23. FIG. 4 is a graph showing a relation between the aspect ratio of the opening and the occurrence of the void in the tungsten layer. As shown in FIG. 4, the void is not produced in the tungsten layer if the aspect ratio of the opening 23 is at least 2.5 or less. In the bipolar transistor according to this structure, the aspect ratio of the opening 23 is 1.8, which means that there is produced no void in the tungsten layer 25.

Figure 2K:
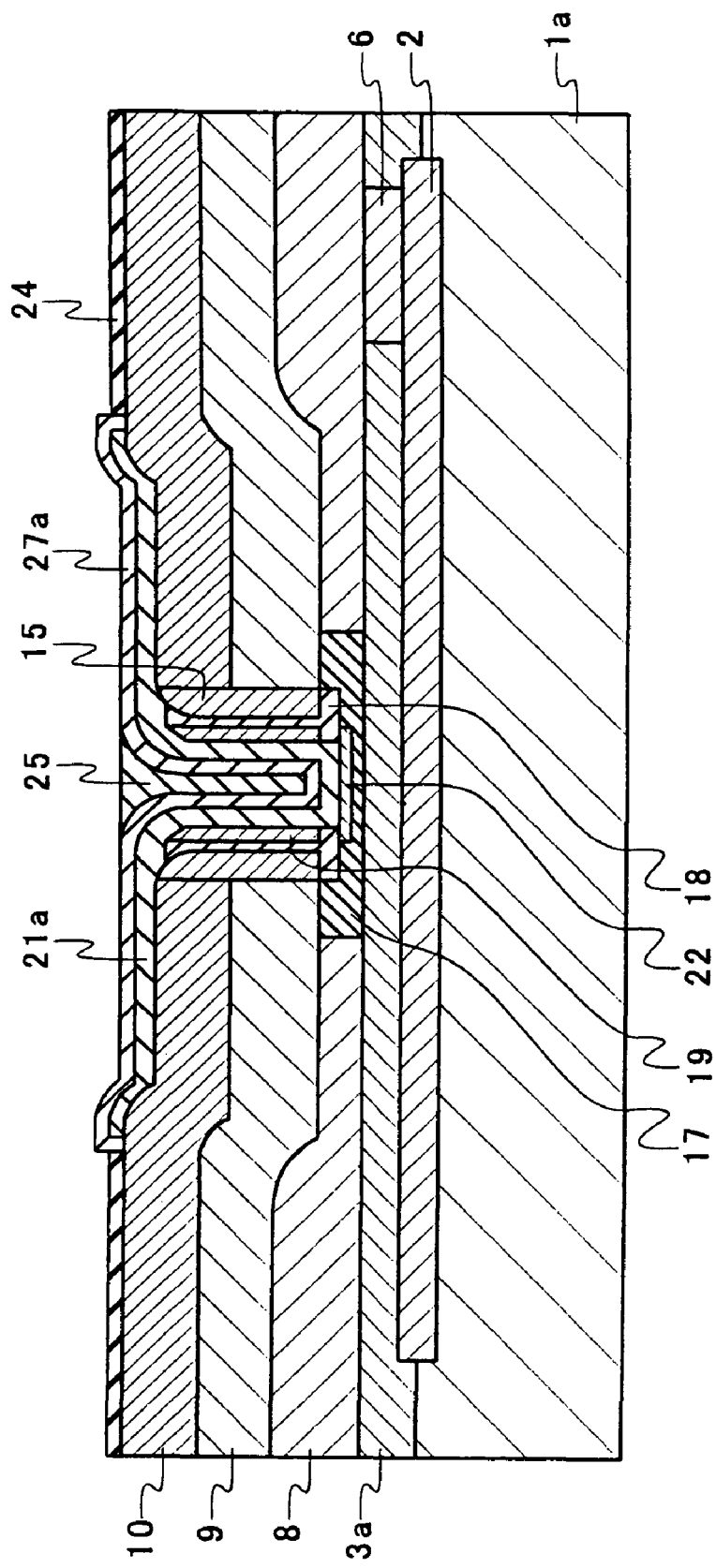
FIG. 2K is a cross sectional view showing a manufacturing process of the bipolar transistor according to the first exemplary embodiment.

Subsequently, as shown in FIG. 2K, the tungsten layer 25 is etched back. As shown in FIG. 2G, the step part 12 is filled with the N+ polysilicon layer 21a and is substantially planarized. Thus, the tungsten layer 25 is removed in other area than the opening 23, and the tungsten layer 25 remains inside the opening 23.

Figure 2L:
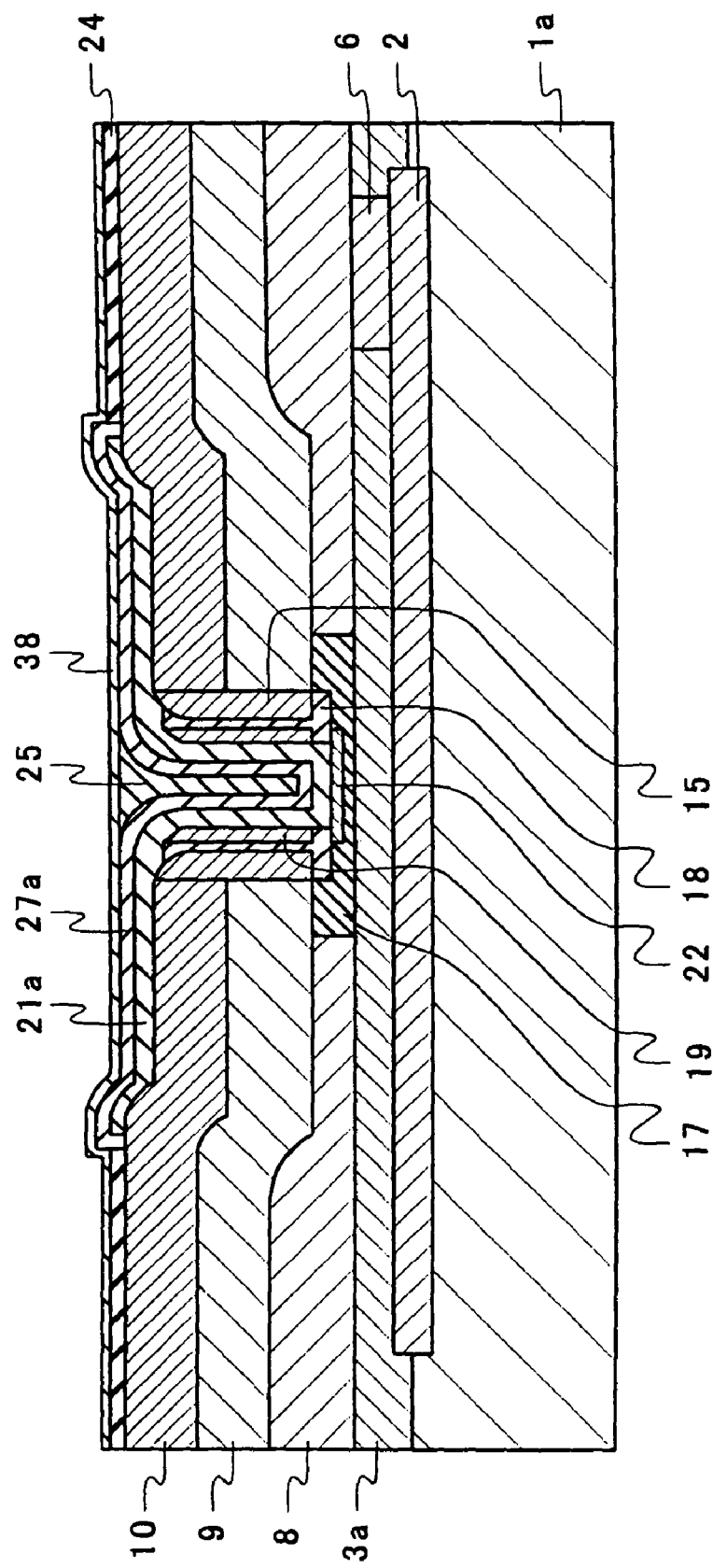
FIG. 2L is a cross sectional view showing a manufacturing process of the bipolar transistor according to the first exemplary embodiment.

Next, as shown in FIG. 2L, a barrier metal layer 38 is formed. Now, the surface of the tungsten layer 25 is not even. Hence, the barrier metal layer 38 may be partially thin or may not be laminated. For example, if the barrier metal layer 38 is formed to satisfy TiN/Ti=about 100 nm/about 50 nm, a part of the tungsten layer 25 may be disappeared due to the influence of the following process. Thus, for example, if the thickness of Ti is set to 100 to 150 nm, disappearance of the tungsten layer 25 can be prevented.

Figure 2M:
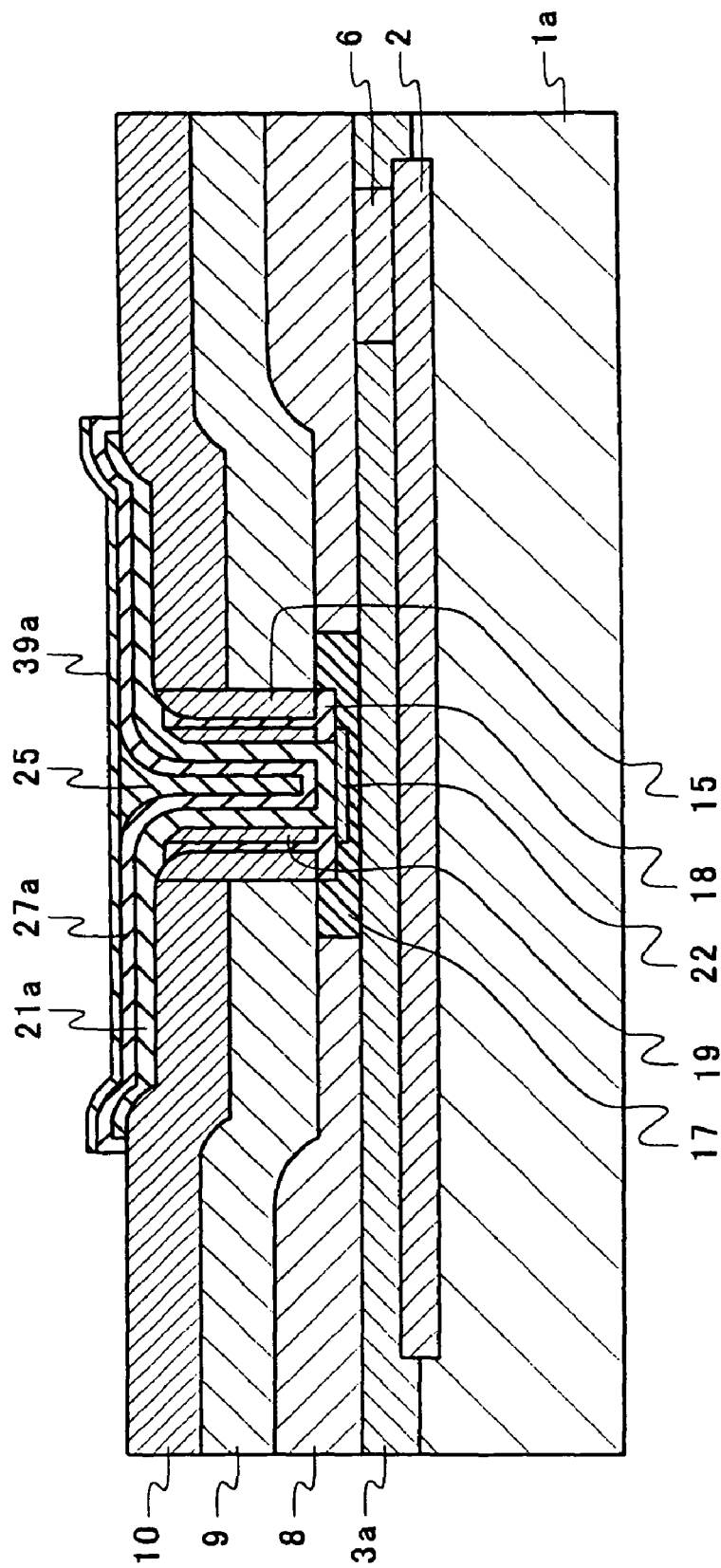
FIG. 2M is a cross sectional view showing a manufacturing process of the bipolar transistor according to the first exemplary embodiment.

Subsequently, as shown in FIG. 2M, sintering is performed and the silicide layer 39a is formed in the barrier metal layer 38 that overlaps with the silicide layer 27a. Then, the barrier metal layer 38 and the barrier metal layer 24 on the nitride silicon layer 10 are removed by wet etching.

Figure 2N:
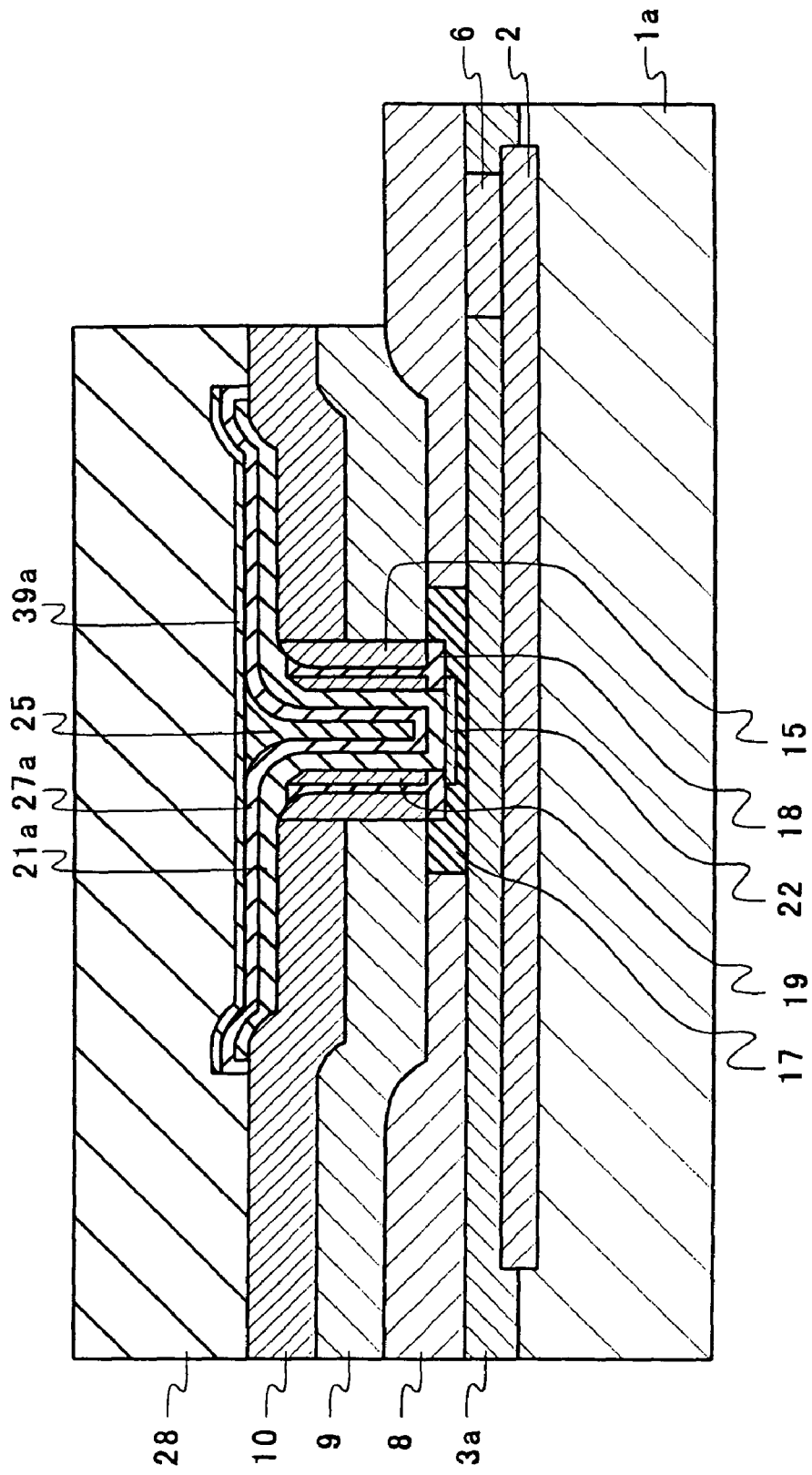
FIG. 2N is a cross sectional view showing a manufacturing process of the bipolar transistor according to the first exemplary embodiment.
Figure 20:
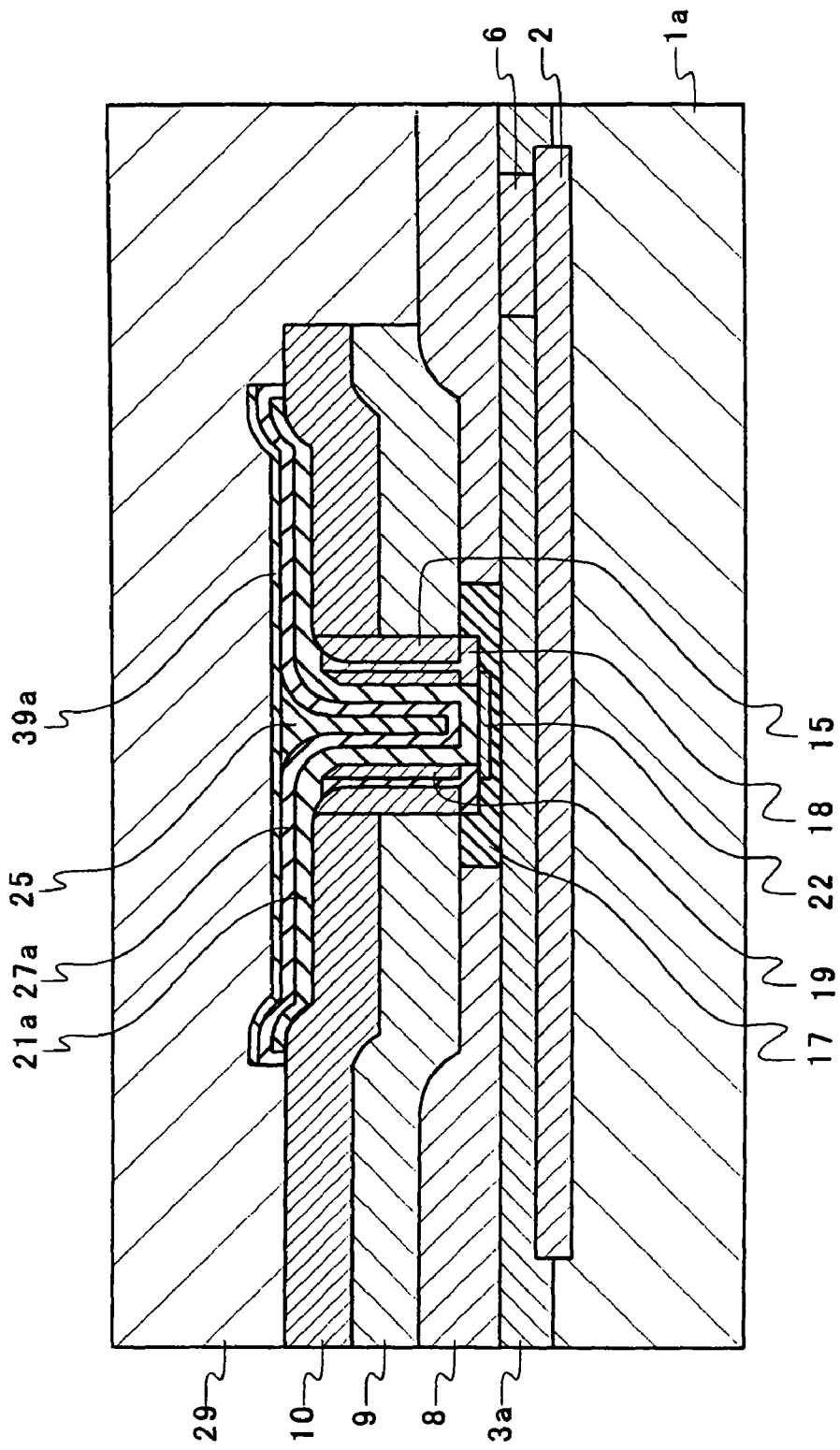

Next, as shown in FIG. 2N, a resist 28 is formed. The nitride silicon layer 10 and the P+ polysilicon layer 9 are removed by anisotropic dry etching using the resist 28 as a mask.

Next, as shown in FIG. 2O, the resist 28 is removed, and the insulation layer 29 is laminated. A BPSG of a plasma TEOS may be used as the insulation layer 29, for example, as it requires low treatment temperature and the deposition rate is fast.

Figure 2P:
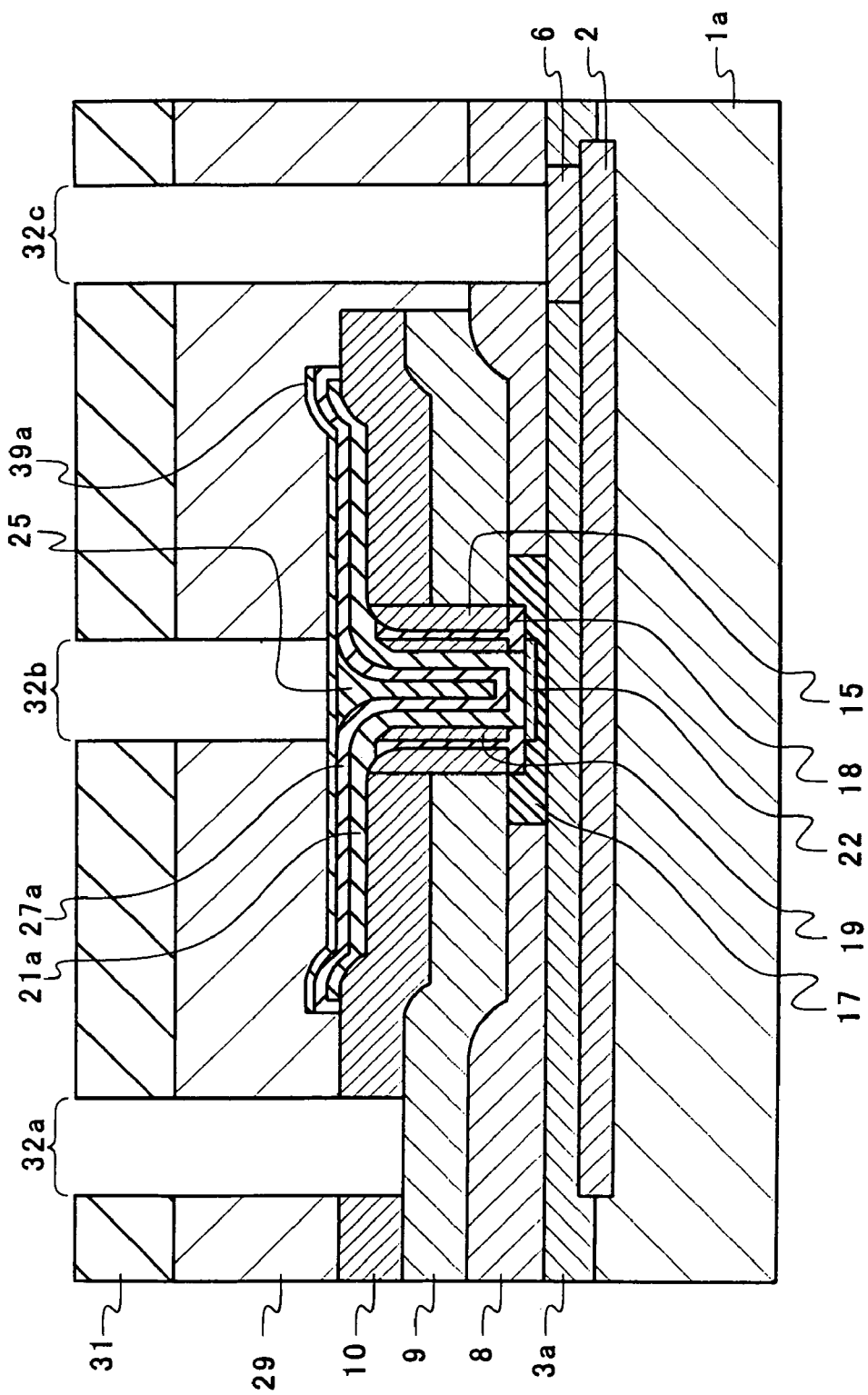
FIG. 2P is a cross sectional view showing a manufacturing process of the bipolar transistor according to the first exemplary embodiment.

Next, as shown in FIG. 2P, a resist 31 is formed by photolithography. Then, anisotropic dry etching is performed using the resist 31 as a mask, so as to form a base contact opening 32a, an emitter contact opening 32b, and a collector contact opening 32c. Since the silicide layer 27a, the silicide layer 39a, and the tungsten layer 25 have already been formed in the bottom part of the emitter contact opening 32b, the underlying N+ polysilicon layer 21a is not etched. Further, the aspect ratios of the base contact opening 32a, the emitter contact opening 32b, and the collector contact opening 32c are 1.5 to 1.8, 1.0 to 1.1, 2.2 to 2.4, respectively.

Figure 2Q:
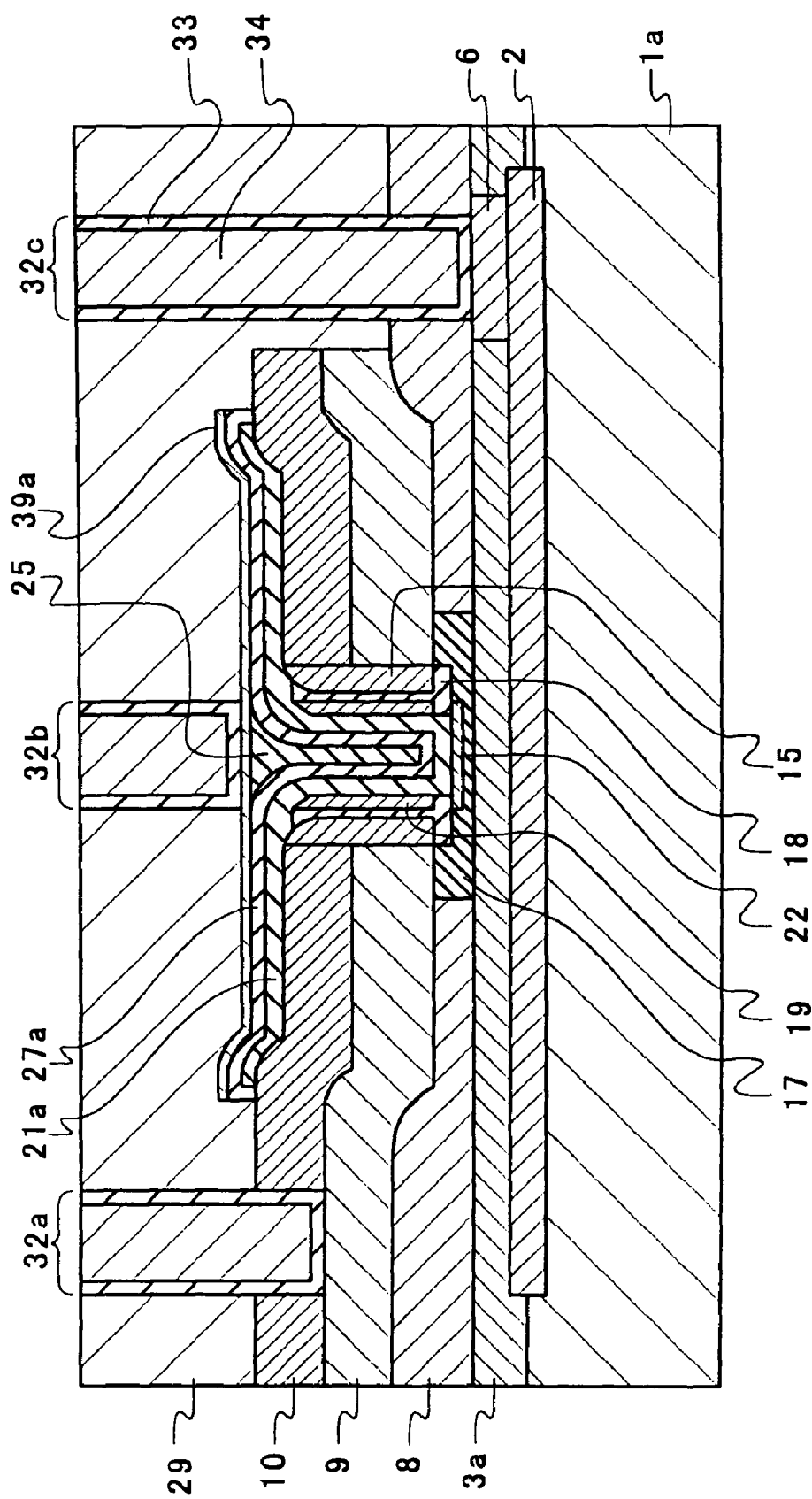
FIG. 2Q is a cross sectional view showing a manufacturing process of the bipolar transistor according to the first exemplary embodiment.
Figure 2R:
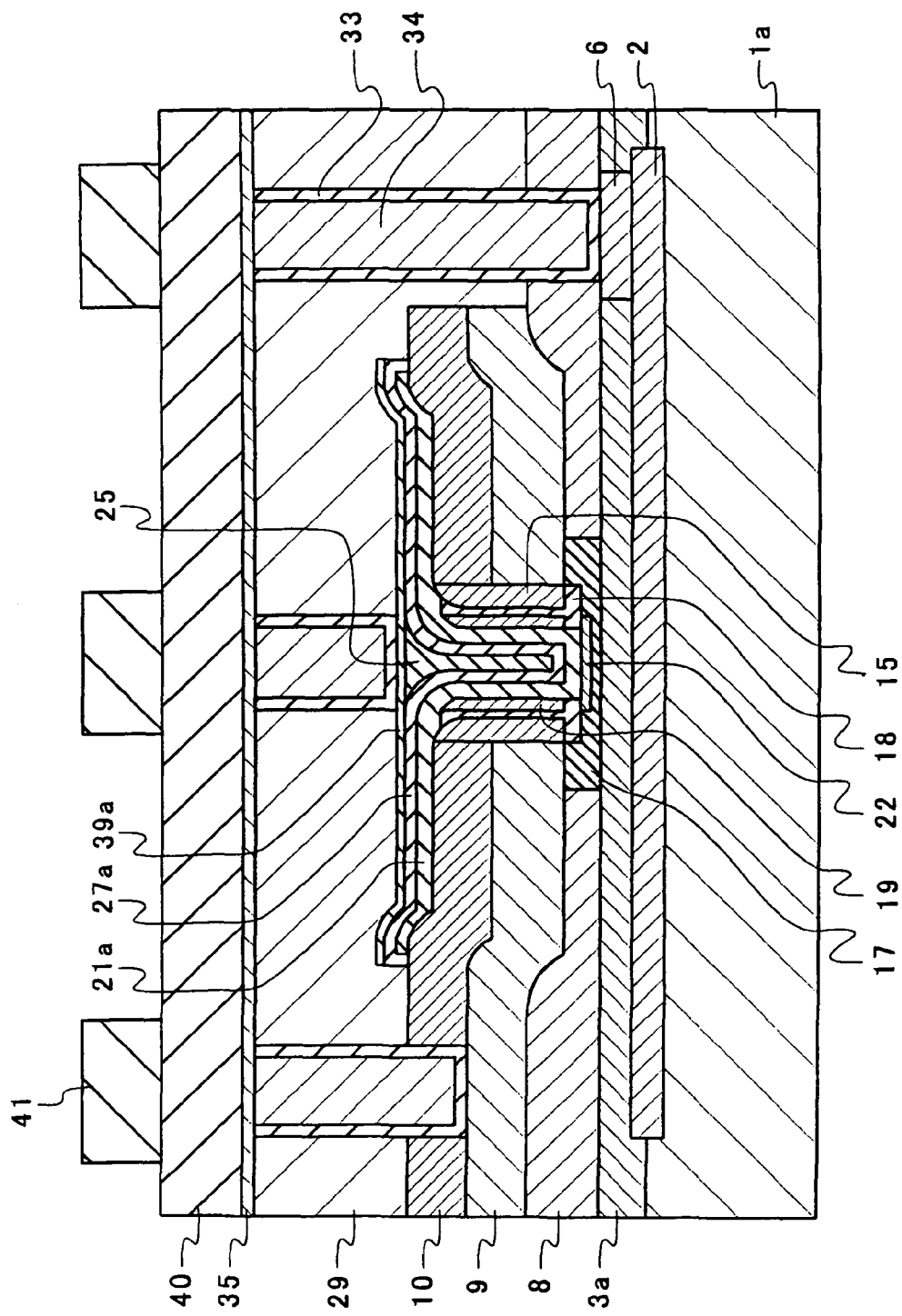
FIG. 2R is a cross sectional view showing a manufacturing process of the bipolar transistor according to the first exemplary embodiment.

Then, as shown in FIG. 2Q, the resist 31 is removed. Subsequently, the barrier metal layer 33 is deposited by sputtering, for example, and thereafter the layer is sintered. In the bottom of the base contact opening 32a, the barrier metal layer 33 and the P+ polysilicon layer 9 are reacted, and a silicide layer (not shown) is formed. In the bottom of the collector contact opening 32c, the barrier metal layer 33 and the N+ lifting layer 6 are reacted, and a silicide layer (not shown) is formed.

Next, the tungsten layer 34 is laminated. Now, the aspect ratios of the base contact opening 32a, the emitter contact opening 32b, and the collector contact opening 32c are 2.4 or less, and thus the void is not produced in the tungsten layer 34 as shown in FIG. 4.

Subsequently, the tungsten layer 34 is etched back, so as to leave the tungsten layer 34 inside the base contact opening 32a, the emitter contact opening 32b, and the collector contact opening 32c. Note that a CMP method may be employed instead of etch back.

Next, as shown in FIG. 2R, the barrier metal layer 35 is formed by sputtering and alloyed. In order to prevent the disappearance of the tungsten layer 34, the barrier metal layer 35 has a two-layer structure of TiN having a thickness of about 100 nm and Ti having a thickness of about 100 to 150 nm, for example. Subsequently, an electrode metal 40 is formed by sputtering or plating. This electrode metal 40 is formed of Al (including alloy of Al such as AiCu, AiSiCu or the like), Cu, Au or the like, for example.

Next, a resist 41 is formed by photolithography. The base electrode 36a, the emitter electrode 36b, and the collector electrode 36c are formed using this resist 41 as a mask, so as to obtain the bipolar transistor as shown in FIG. 1.

Thereafter, a normal interlayer film, a multi-layer electrode, and a passivation are formed, and the manufacturing process of the bipolar transistor is thus completed.

Figure 5:
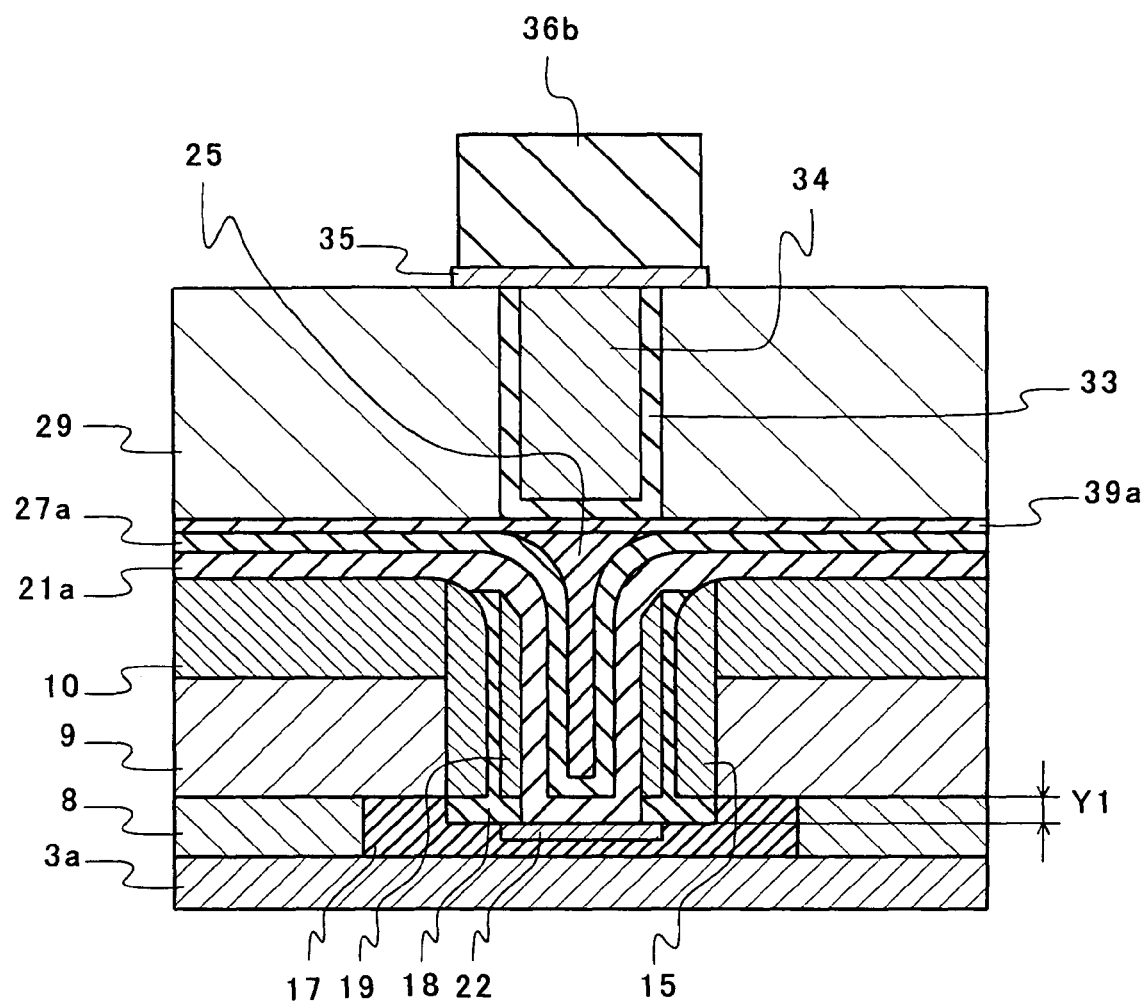
FIG. 5 is an enlarged cross sectional view of an emitter part of the bipolar transistor according to the first exemplary embodiment.

FIG. 5 is an enlarged cross sectional view of the emitter part of the bipolar transistor shown in FIG. 1. According to the manufacturing method stated above, after forming the N+ polysilicon layer 21a and the silicide layer 27a, the tungsten layer 25 is formed to fill the opening 23, so that the N+ polysilicon layer 21a is protected. Thus, the thickness of the N+ polysilicon layer 21a is not decreased due to the influence of the subsequent processing. Thus, the thickness Y1 of the N+ polysilicon layer 21a shown in FIG. 5 is not reduced but kept to 105 to 130 nm, and the base current density and VF are both constant.

Further, the upper part of the tungsten layer 25 is covered with the silicide layer 39a, and thus the tungsten layer 25 is not corroded due to the influence of the subsequent processing. Hence, with this bipolar transistor, increase of resistance due to the corrosion of the tungsten layer and decrease of reliability can be prevented.

As described above, according to this structure, it is possible to obtain the bipolar transistor having high reliability that makes it possible to reduce the variation of hFE and prevent increase of the resistance.

First Comparative Example

Figure 6:
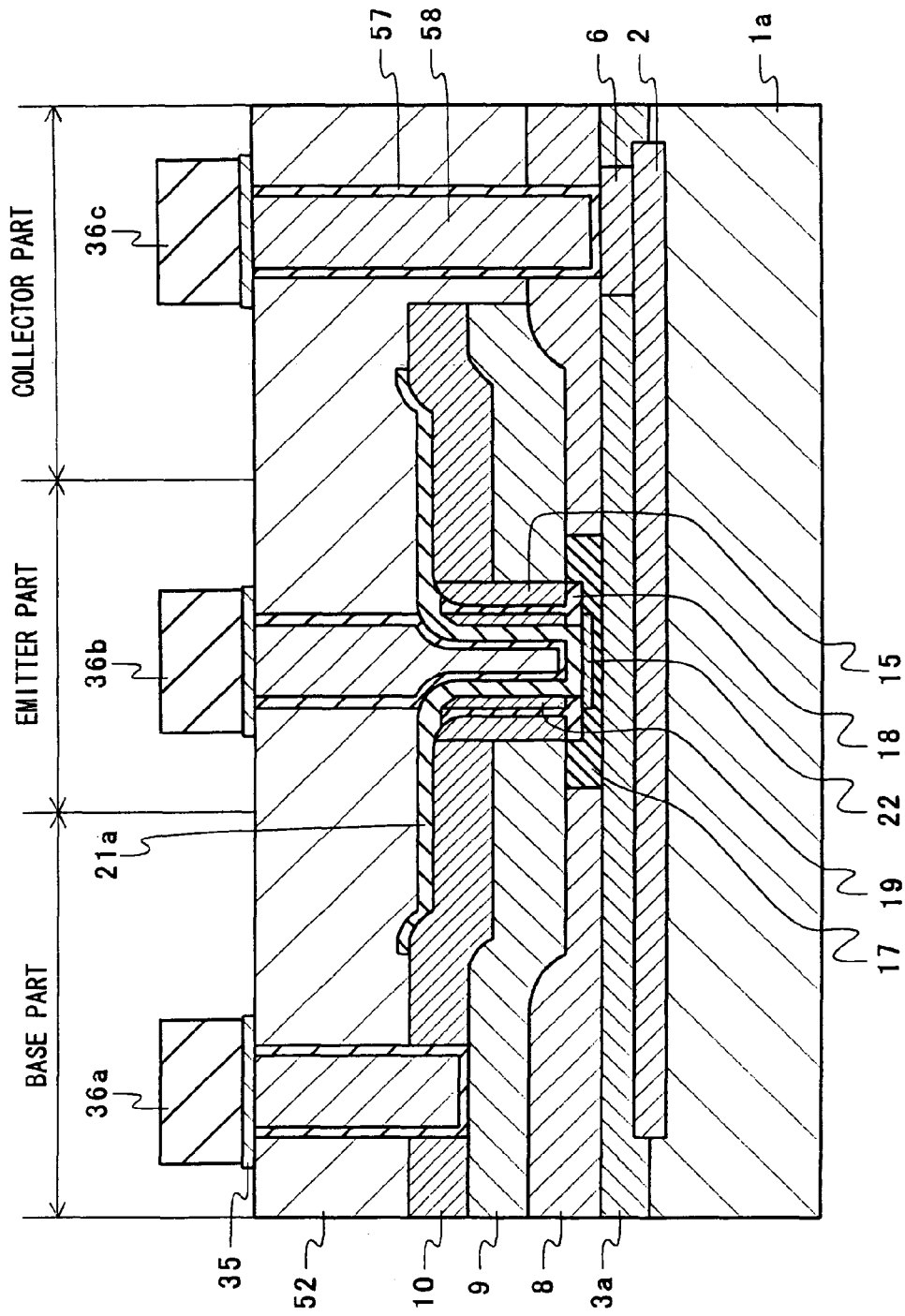
FIG. 6 is a cross sectional view of a bipolar transistor according to a first comparative example.

Next, as the first comparative example, description will be made on a bipolar transistor having no silicide layer 27a and silicide layer 39a shown in FIG. 1. FIG. 6 is a cross sectional view showing the structure of the bipolar transistor according to the first comparative example. As shown in FIG. 6, this bipolar transistor includes the base part, the emitter part, and the collector part. In the following description, the same components as those shown in FIG. 1 are denoted by the same reference symbols, and only the parts different from FIG. 1 will be described.

In the base part of the bipolar transistor, a tungsten layer 58 is formed to be covered with a barrier metal layer 57 that contacts with the P+ polysilicon layer 9 by penetrating an insulation layer 52 and the nitride silicon layer 10.

In the emitter part, the silicide layer 27a and the silicide layer 39a as shown in FIG. 1 are not provided, and the barrier metal layer 57 is formed to contact with the N+ polysilicon layer 21a by penetrating the insulation layer 52. The tungsten layer 58 is formed thereon.

In the collector part, the tungsten layer 58 is formed to be covered with the barrier metal layer 57 that contacts with the N+ lifting layer 6 by penetrating the insulation layer 52 and the oxide silicon layer 8.

Other structures are similar to those shown in FIG. 1, and thus description will be omitted.

Figure 7A:
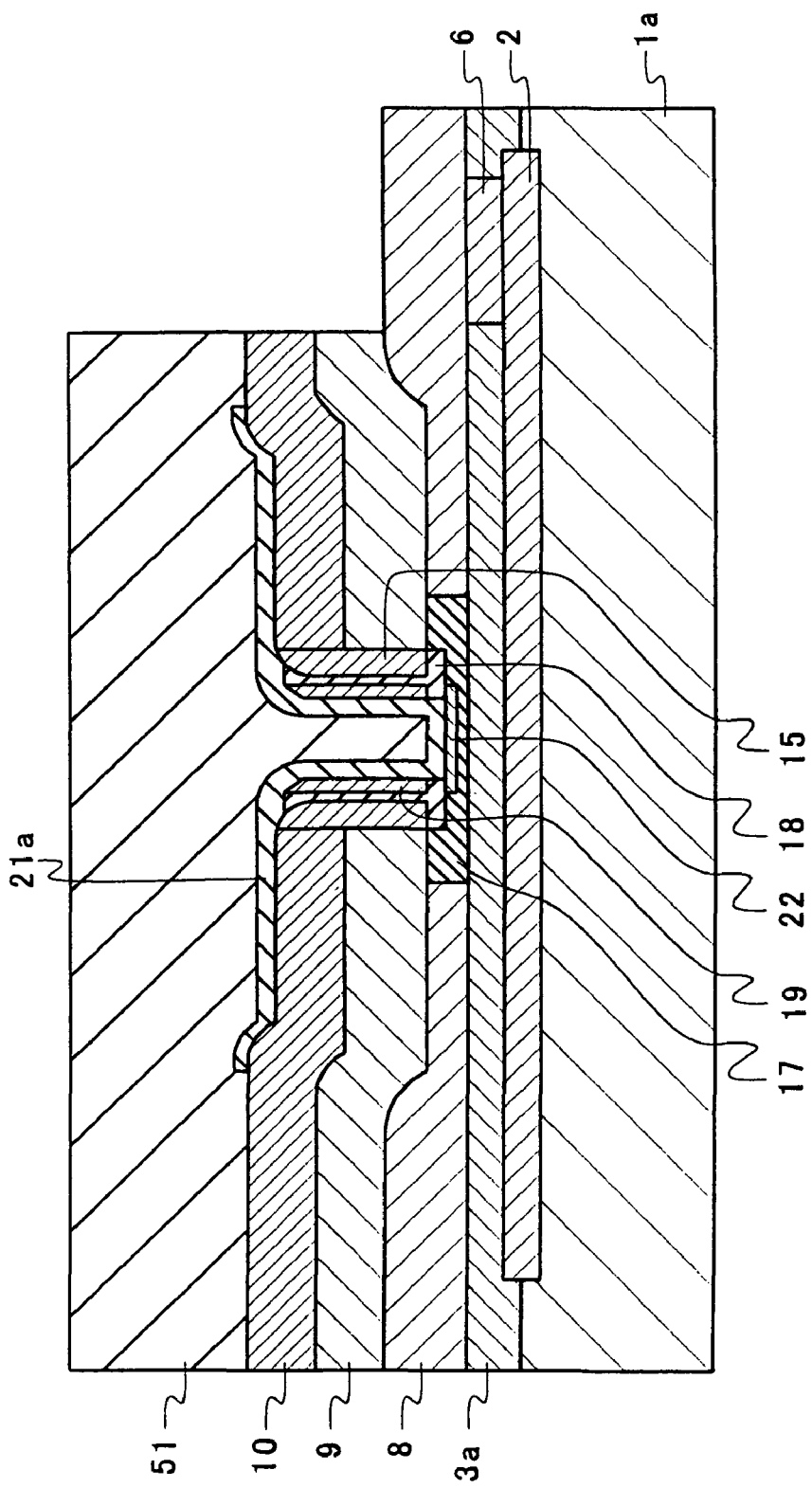
FIG. 7A is a cross sectional view showing a manufacturing process of the bipolar transistor according to the first comparative example.
Figure 7B:
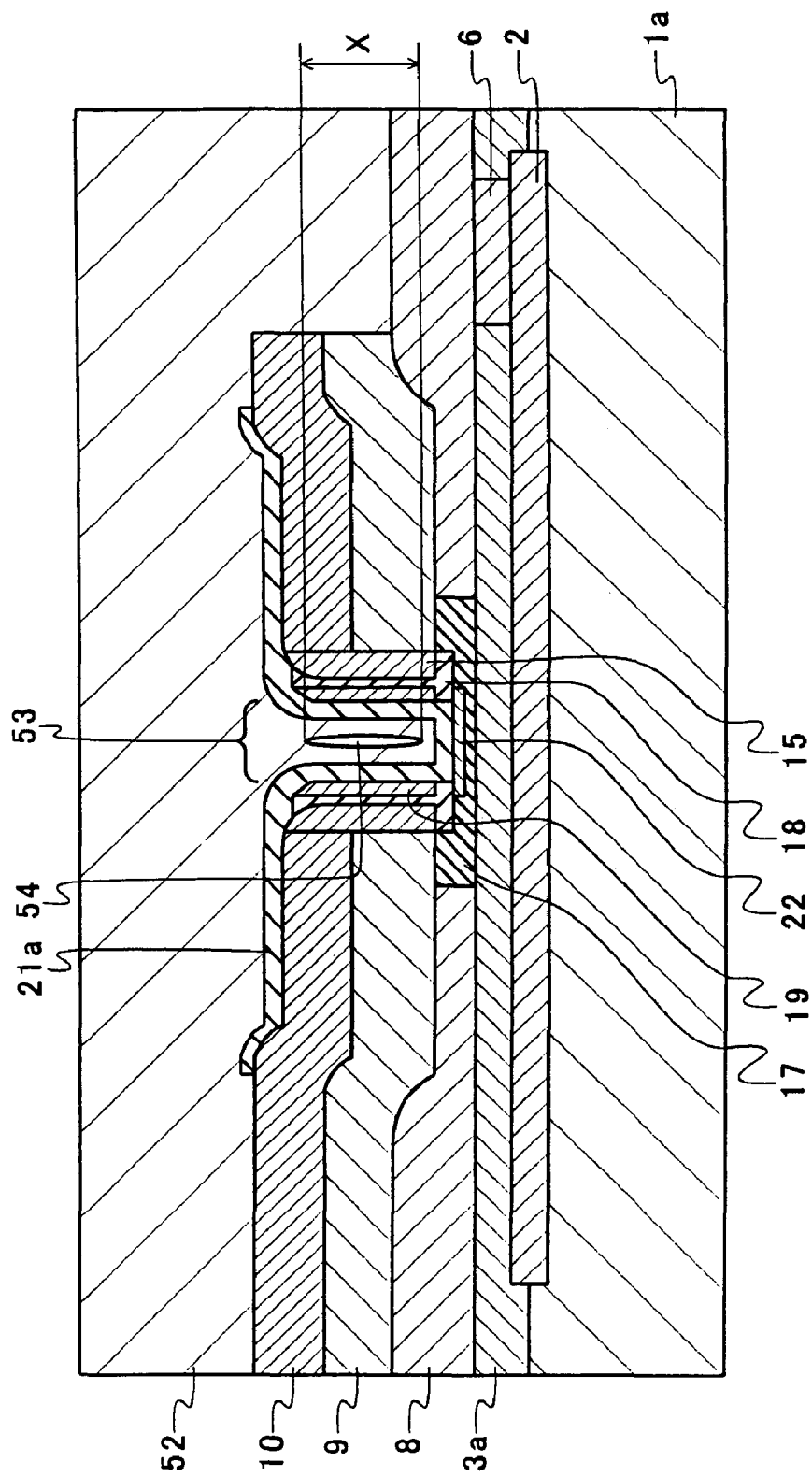
FIG. 7B is a cross sectional view showing a manufacturing process of the bipolar transistor according to the first comparative example.
Figure 7C:
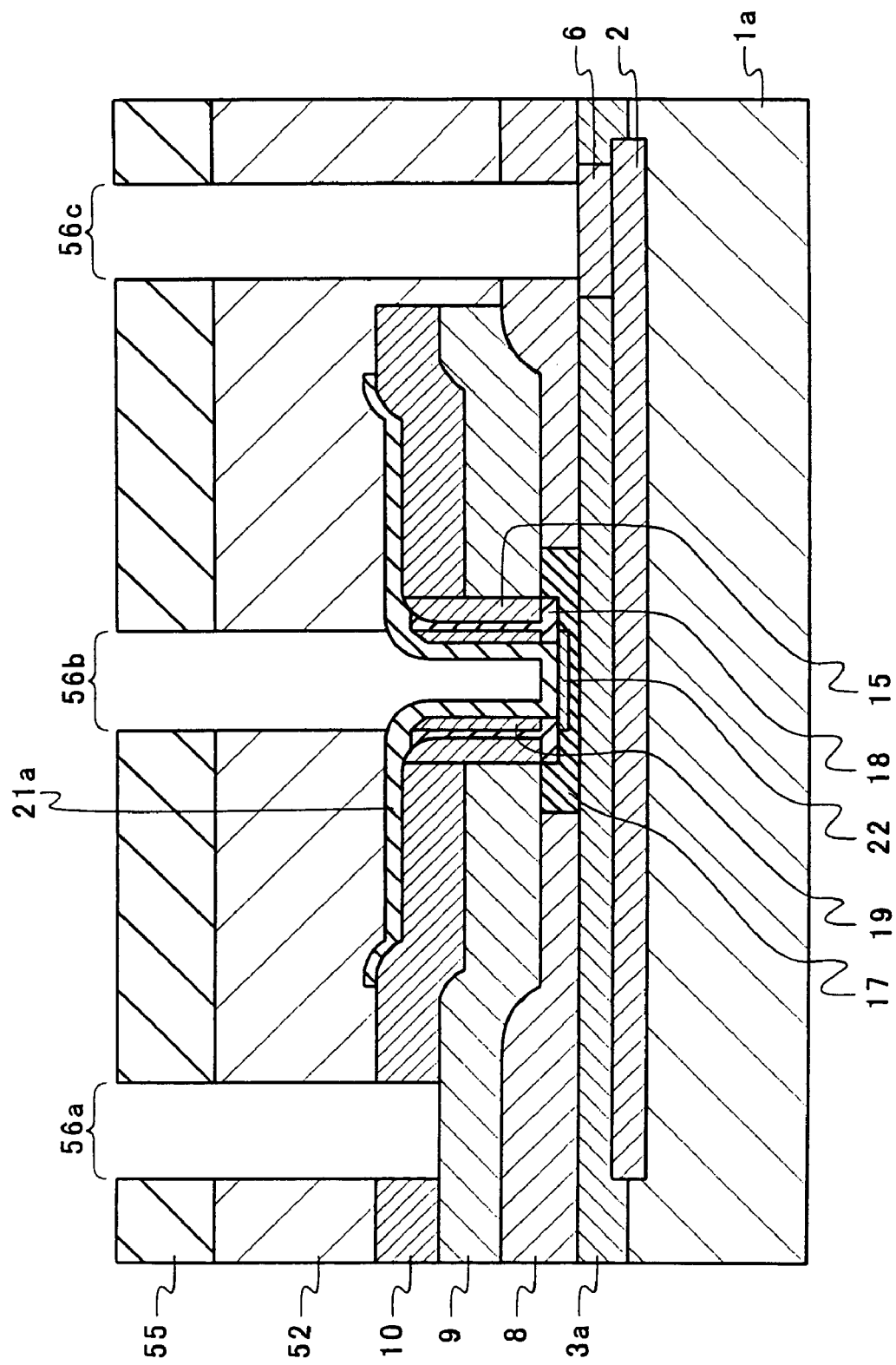
FIG. 7C is a cross sectional view showing a manufacturing process of the bipolar transistor according to the first comparative example.

Next, the manufacturing method of the bipolar transistor according to the first comparative example will be described. FIGS. 7A to 7C are cross sectional views showing manufacturing processes of the bipolar transistor according to the first comparative example. Note that the manufacturing method shown in FIGS. 2A to 2G in the first exemplary embodiment is similar to that in the first comparative example, and thus description will be omitted.

After forming the N+ polysilicon layer 21a shown in FIG. 2G, a resist 51 is formed by photolithography, as shown in FIG. 7A. After that, the nitride silicon layer 10 and the P+ polysilicon layer 9 are removed by anisotropic dry etching using the resist 51 as a mask.

Next, as shown in FIG. 7B, after removing the resist 51, the insulation layer 52 having a thickness of about 1.5 μm is deposited by atmospheric pressure CVD, for example. At this time, in order to suppress the influence on the B-doped SiGe layer 17, a BPSG of a plasma TEOS is used, for example, as the insulation layer 52 as it requires low treatment, temperature and the deposition rate is fast. At this time, the opening 53 has an aspect ratio of about 1.8, and there is produced a void 54 due to the following reason. The length X of the void is about 0.34 μm.

Next, the insulation layer 52 is planarized by an etch back method or a CMP method, for example. Subsequently, as shown in FIG. 7C, a resist 55 is formed by photolithography. Then, anisotropic dry etching is performed using the resist 55 as a mask, so as to collectively form a base contact opening 56a, an emitter contact opening 56b, and a collector contact opening 56c. The anisotropic dry etching time is set so as to perfectly remove the oxide silicon layer 8 in the bottom part of the deepest collector contact opening 56c. By performing anisotropic dry etching, the N+ polysilicon layer 21a is exposed at the bottom of the emitter contact opening 56b. Hence, the N+ polysilicon layer 21a is overetched and the thickness is reduced.

Next, the resist 55 is removed. Subsequently, the barrier metal layer 57 is formed by sputtering, for example, thereafter sintering is performed. Then, at the bottom of the base contact opening 56a, the emitter contact opening 56b, and the collector contact opening 56c, a silicide layer (not shown) is formed after the barrier metal layer 57 and the P+ polysilicon layer 9, the barrier metal layer 57 and the N+ polysilicon layer 21a, and the barrier metal layer 57 and the N+ lifting layer 6 are reacted, respectively.

Next, the tungsten layer 58 is deposited, and thereafter performing etching back, so as to leave the tungsten layer 58 on the inner walls of the base contact opening 56a, the emitter contact opening 56b, and the collector contact opening 56c.

Next, the barrier metal layer 35 is formed by sputtering, for example, and then alloyed. Subsequently, an electrode metal (not shown) is deposited by sputtering or plating, for example. This electrode metal is formed by Al (including Al alloy such as AiCu, AiSiCu or the like), Cu, Au or the like, for example.

Next, a resist mask (not shown) is formed by photolithography. Subsequently, dry etching is performed using this resist mask, so as to shape the barrier metal layer 35 and the electrode metal by etching. Thus, the base electrode 36a, the emitter electrode 36b, and the collector electrode 36c are formed, thereby obtaining the bipolar transistor as shown in FIG. 6.

After that, a general interlayer film, a multi-layer electrode, a passivation film and the like are formed, and thus the manufacturing process of the bipolar transistor is completed.

According to the bipolar transistor and the manufacturing method thereof according to the first comparative example, the insulation layer 52 is removed so as to expose the $N^+$ lifting layer 6 in the bottom part of the collector contact opening 56C by anisotropic dry etching. Thus, it is impossible to prevent overetching in the bottom part of the emitter contact opening 56b and decrease of the thickness of the $N^+$ polysilicon layer 21a.

Figure 8:
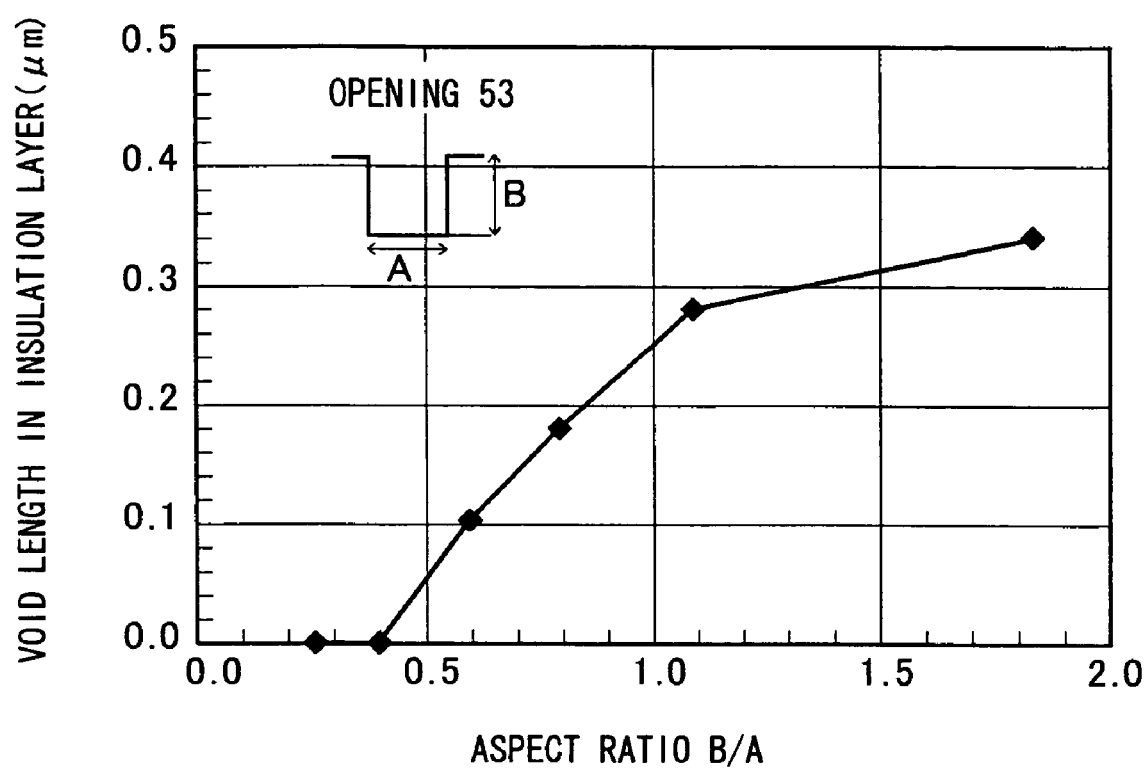
FIG. 8 is a graph showing a relation between an aspect ratio of an opening and a void length of an insulation layer.

Further, there is a void 54 in the insulation layer 52 that fills the opening 53. FIG. 8 is a graph showing a relation between the aspect ratio of the opening and the length of the void in the insulation layer. The BPSG of the plasma TEOS employed in the insulation layer 52 has poor step coverage. In the first comparative example in which the aspect ratio of the opening 53 is 1.8, the insulation layer 52 is deposited in the upper part of the opening 53 and the opening 53 is filled with the insulation layer 52. Thus, the flow of the material gas is interrupted and the insulation layer is not locally deposited, and there is produced a void 54.

In the part where the void 54 is produced, the substantial thickness of the insulation layer 52 is reduced. Accordingly, when the insulation layer 52 is removed, it is the $N^+$ polysilicon layer 21a just below the void 54 that is exposed first. Thus, in the $N^+$ polysilicon layer 21a that is exposed, overetching is started early, and the thickness is further reduced.

Figure 9:
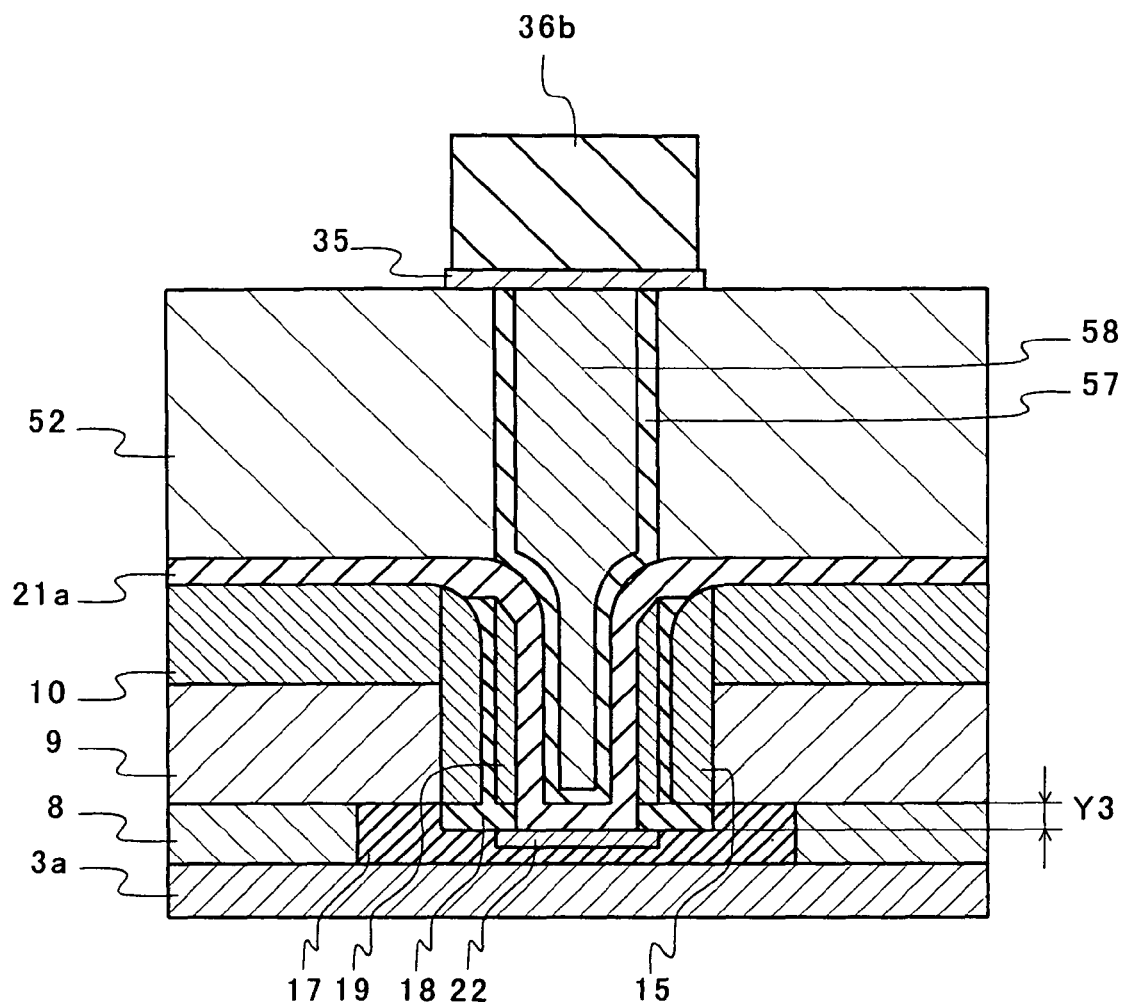
FIG. 9 is an enlarged cross sectional view showing an emitter part of the bipolar transistor according to the first comparative example.

FIG. 9 is an enlarged view of the emitter part of the bipolar transistor shown in FIG. 6. The thickness of the $N^+$ polysilicon layer 21a which is immediately above the emitter diffusion layer 22 is reduced as the $N^+$ polysilicon layer 21a is overetched when the insulation layer 52 is dry etched. The thickness Y3 of the $N^+$ polysilicon layer 21a shown in FIG. 9 satisfies 89.8 nm$\leq$Y3$\leq$131 nm. Thus, in a part that satisfies Y3<100 nm in the wafer surface, as shown in FIG. 16, the base current density becomes high, and hFE and other characteristics vary.

From the above description, according to the bipolar transistor and the manufacturing method thereof in the first comparative example, as is different from the first exemplary embodiment, decrease of hFE due to the decrease of the thickness of the $N^+$ polysilicon cannot be prevented.

Second Exemplary Embodiment

Figure 10:
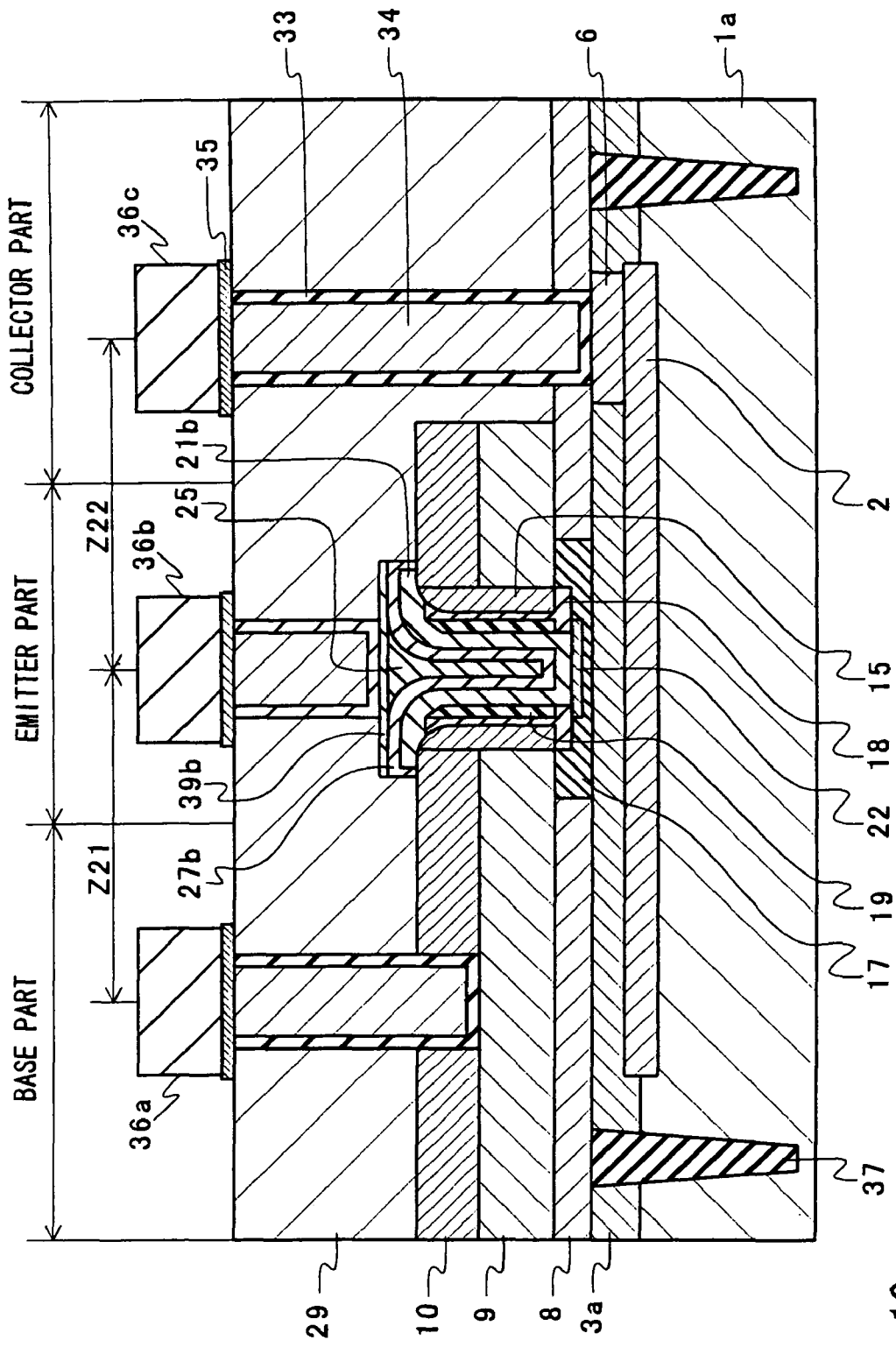
FIG. 10 is a cross sectional view of a bipolar transistor according to a second exemplary embodiment.

Now, the structure of a bipolar transistor according to the second exemplary embodiment will be described. FIG. 10 is a cross sectional view of the bipolar transistor according to the second exemplary embodiment. As shown in FIG. 10, this bipolar transistor includes the base part, the emitter part, and the collector part, as is similar to the first exemplary embodiment.

In this bipolar transistor, the oxide silicon layer 8 is formed to have the even thickness, and thus the step part 12 shown in FIG. 1 is not produced. Thus, as there is no need to fill the step part with an $N^+$ polysilicon layer 21b, the size of the $N^+$ polysilicon layer 21b, a silicide layer 27b, and a silicide layer 39b can be reduced.

Further, an element isolation zone 37 is formed in the $P^-$ silicon substrate 1a. Other structures are similar to those shown in FIG. 1, and thus description will be omitted.

According to this structure, as is similar to the bipolar transistor shown in FIG. 1, it is possible to obtain the bipolar transistor having high reliability that makes it possible to decrease the variation of hFE and prevent the increase of the resistance.

Furthermore, according to this structure, the size of the $N^+$ polysilicon layer 21b, the silicide layer 27b, and the silicide layer 39b can be reduced. Hence, the relation between the electrode distances Z11 and Z12 shown in FIG. 1 and the electrode distances Z21 and Z22 shown in FIG. 10 may be set as Z11>Z21 and Z12>Z22. Hence, the device area of the bipolar transistor can be reduced.

Accordingly, by employing this structure, the integrity of the bipolar transistor can further be enhanced.

As the element isolation zone 37 is provided, this bipolar transistor can be applied to a bipolar IC (Integrated Circuit) or to a BiCMOS (Bipolar Complementary Metal Oxide Semiconductor), thereby improving the non-defective yield of the bipolar IC or the BiCMOS. The bipolar transistor according to this structure can be particularly useful in a circuit that requires even transistor characteristics such as a current mirror or a differential amplifier used in an analog circuit, for example.

Third Exemplary Embodiment

Figure 11:
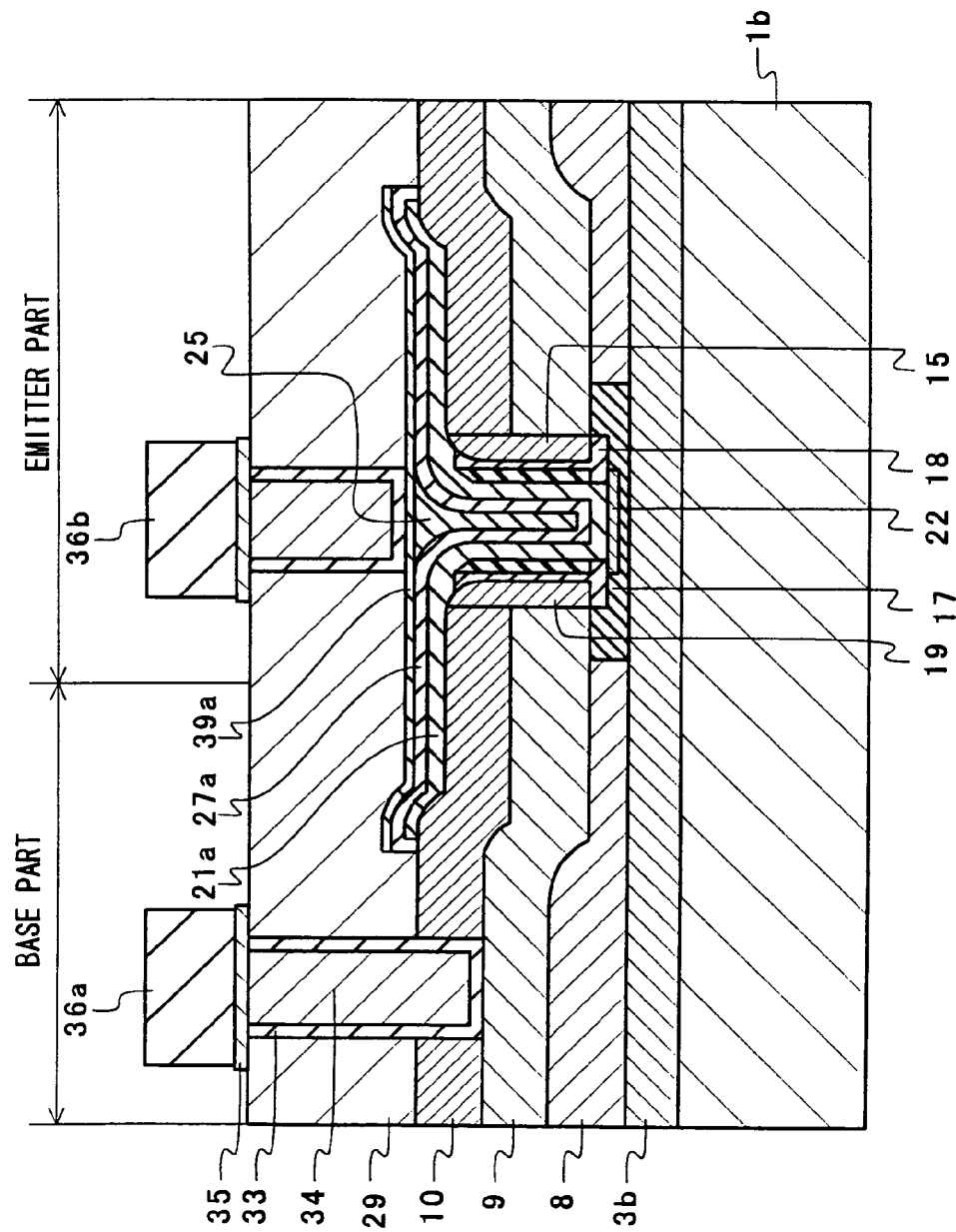
FIG. 11 is a cross sectional view of a bipolar transistor according to a third exemplary embodiment.
Figure 12:
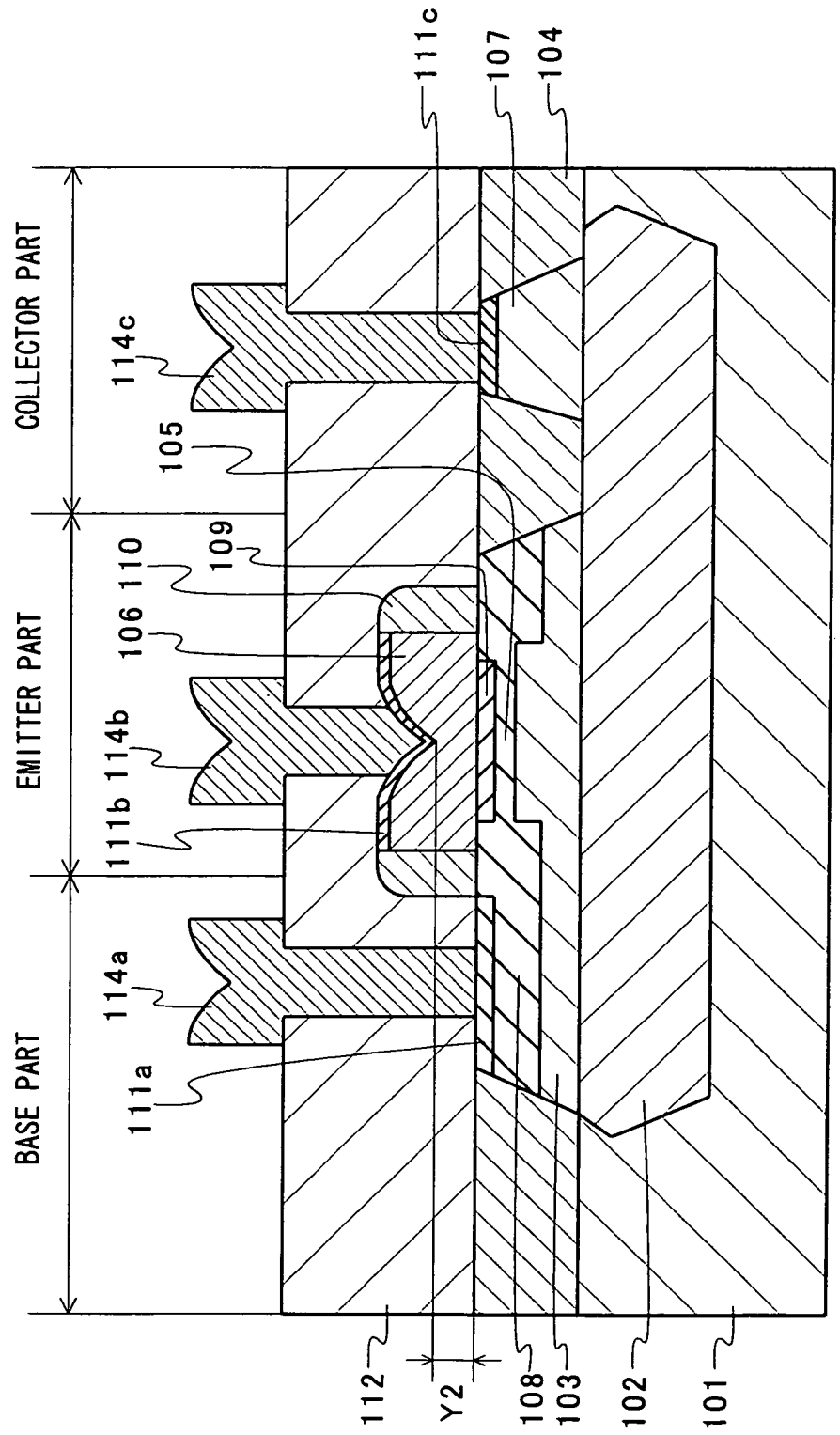
FIG. 12 is a cross sectional view of a bipolar transistor disclosed in Japanese Unexamined Patent Application Publication No. 2002-43321.
Figure 13A:
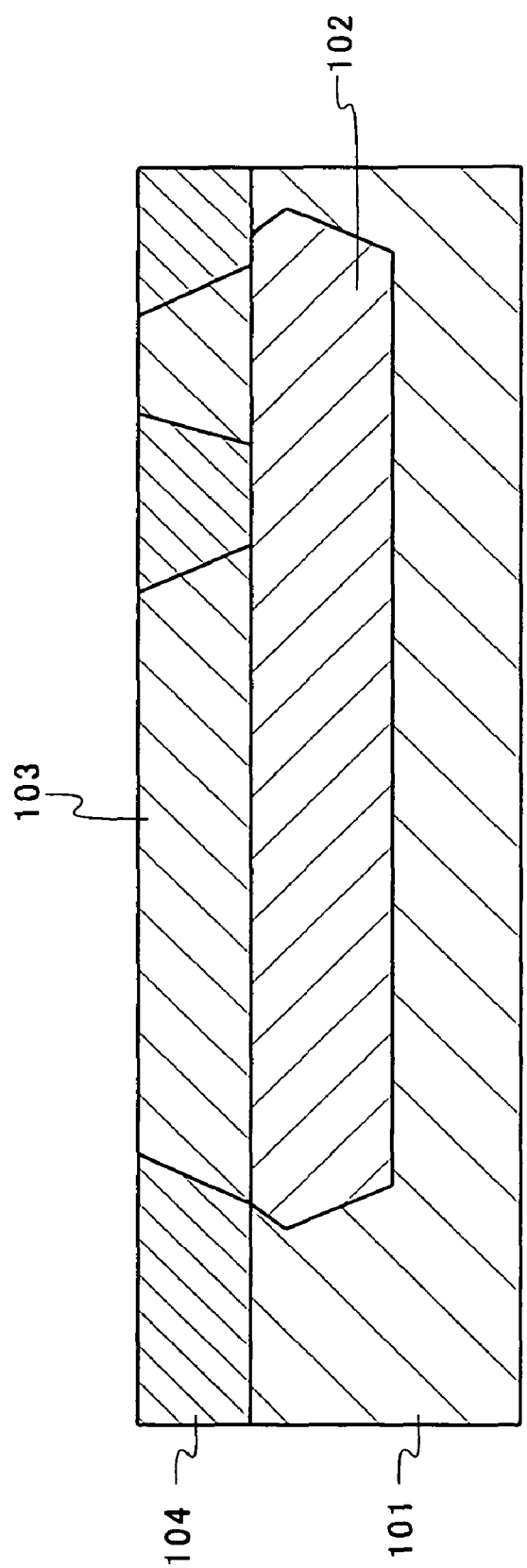
FIG. 13A is a cross sectional view showing a manufacturing process of the bipolar transistor disclosed in Japanese Unexamined Patent Application Publication No. 2002-43321.
Figure 13B:
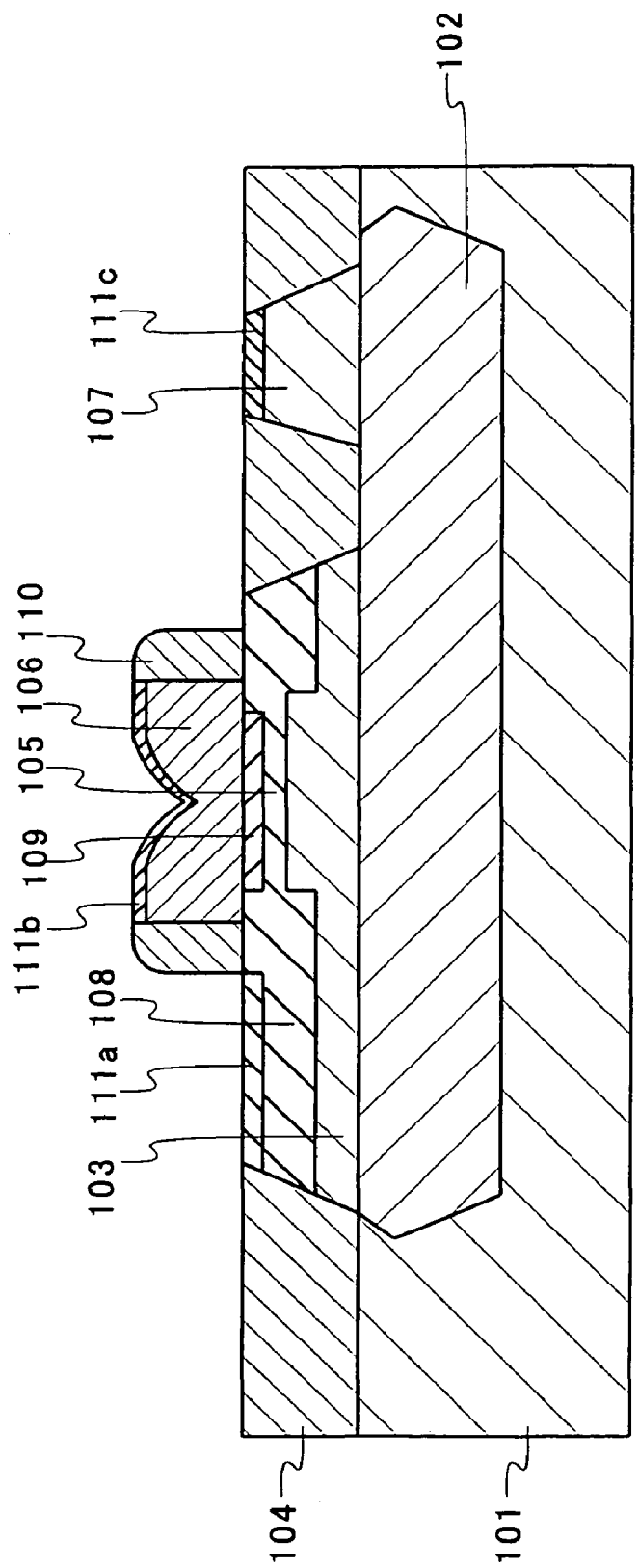
FIG. 13B is a cross sectional view showing a manufacturing process of the bipolar transistor disclosed in Japanese Unexamined Patent Application Publication No. 2002-43321.
Figure 13C:
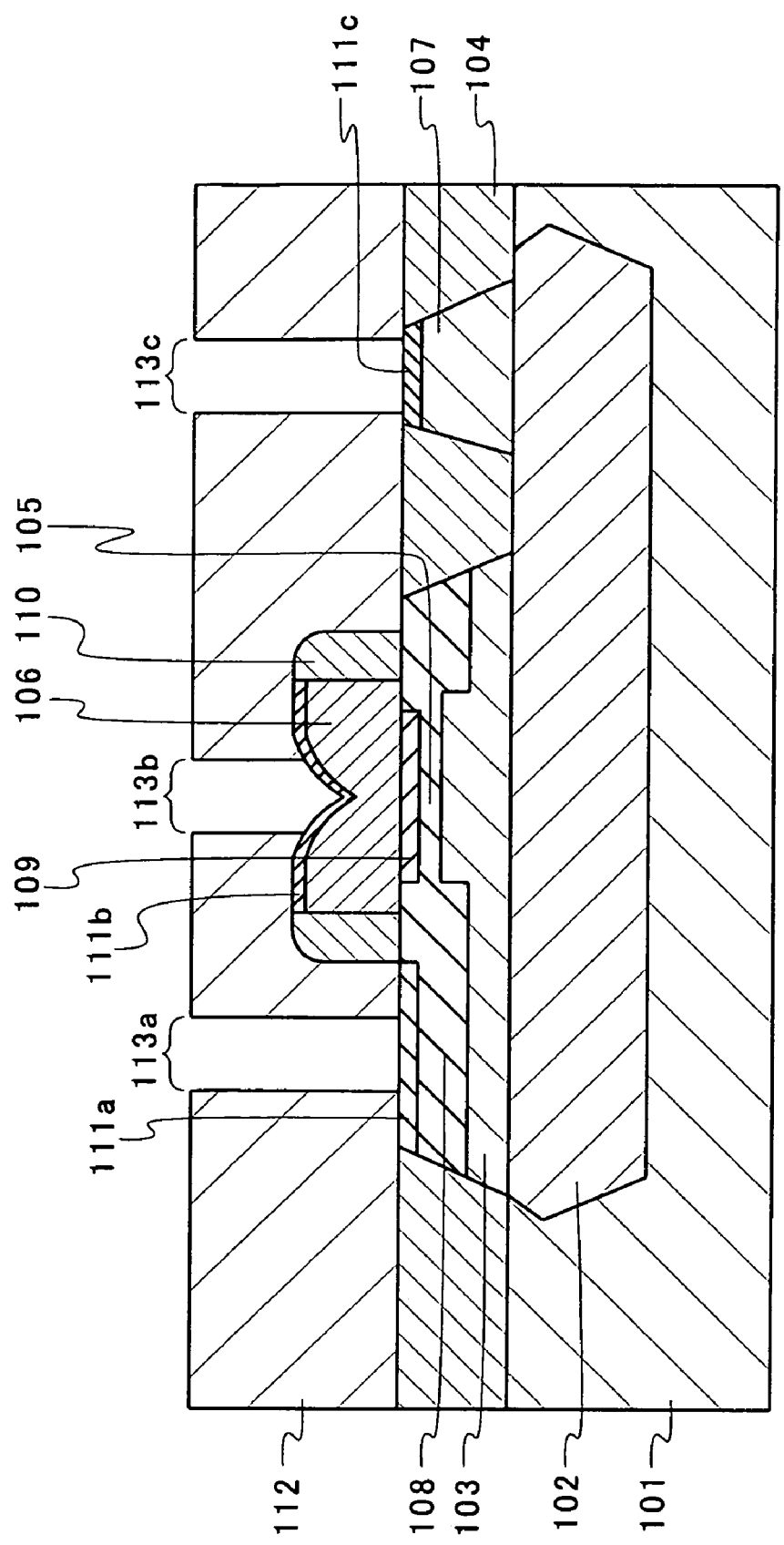
FIG. 13C is a cross sectional view showing a manufacturing process of the bipolar transistor disclosed in Japanese Unexamined Patent Application Publication No. 2002-43321.
Figure 14:
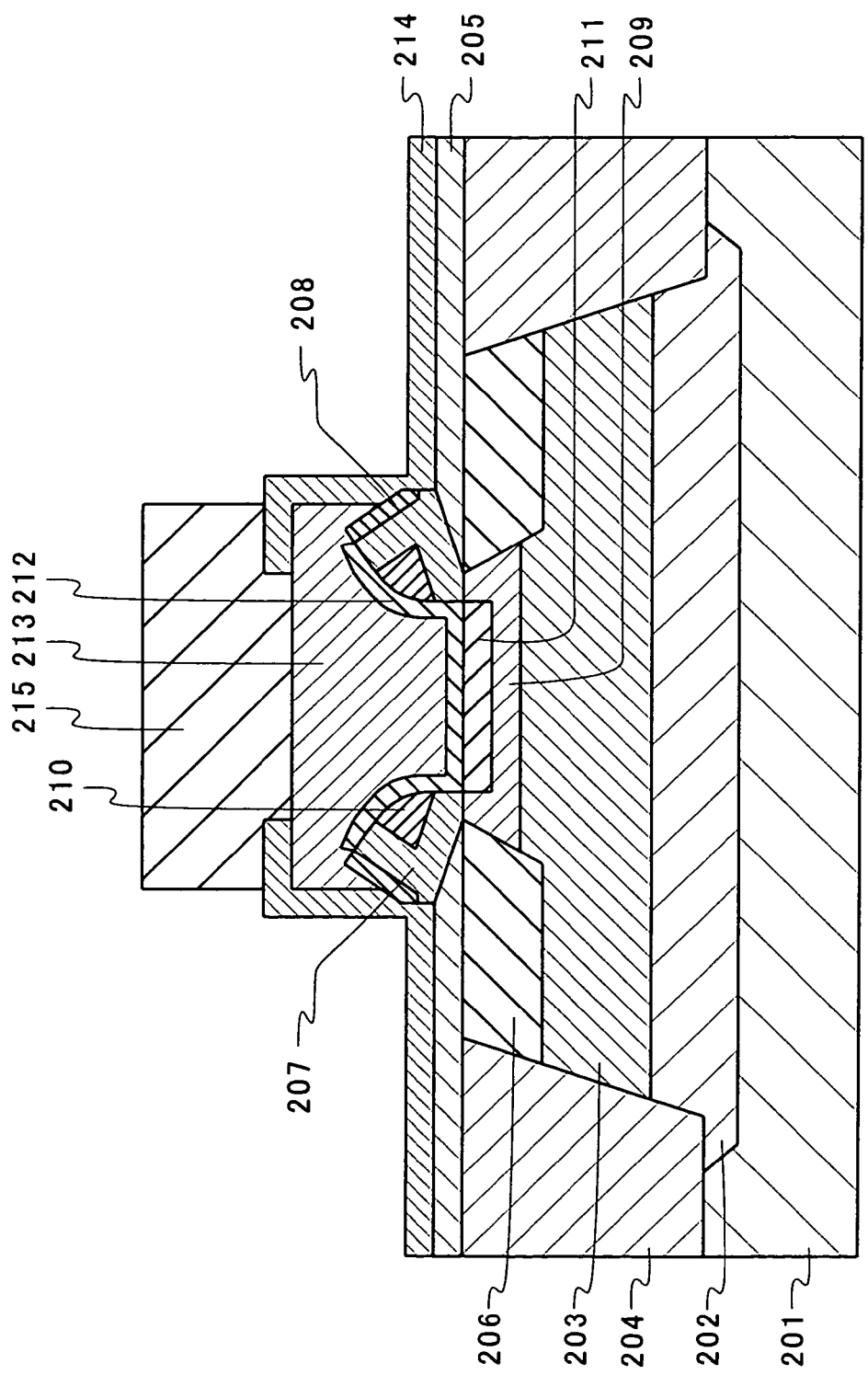
FIG. 14 is a cross sectional view of a bipolar transistor disclosed in Japanese Unexamined Patent Application Publication No. 6-53229.
Figure 15A:
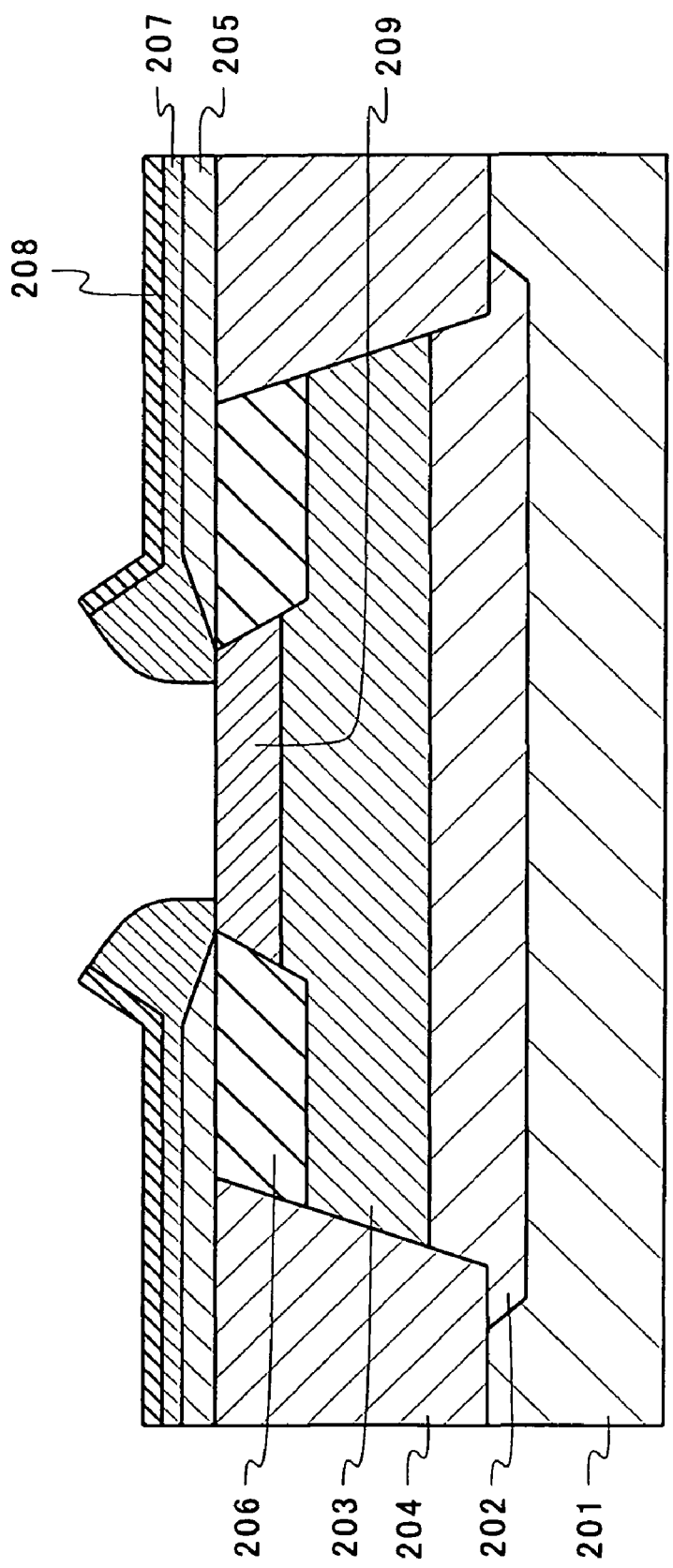
FIG. 15A is a cross sectional view showing a manufacturing process of the bipolar transistor disclosed in Japanese Unexamined Patent Application Publication No. 6-53229.
Figure 15B:
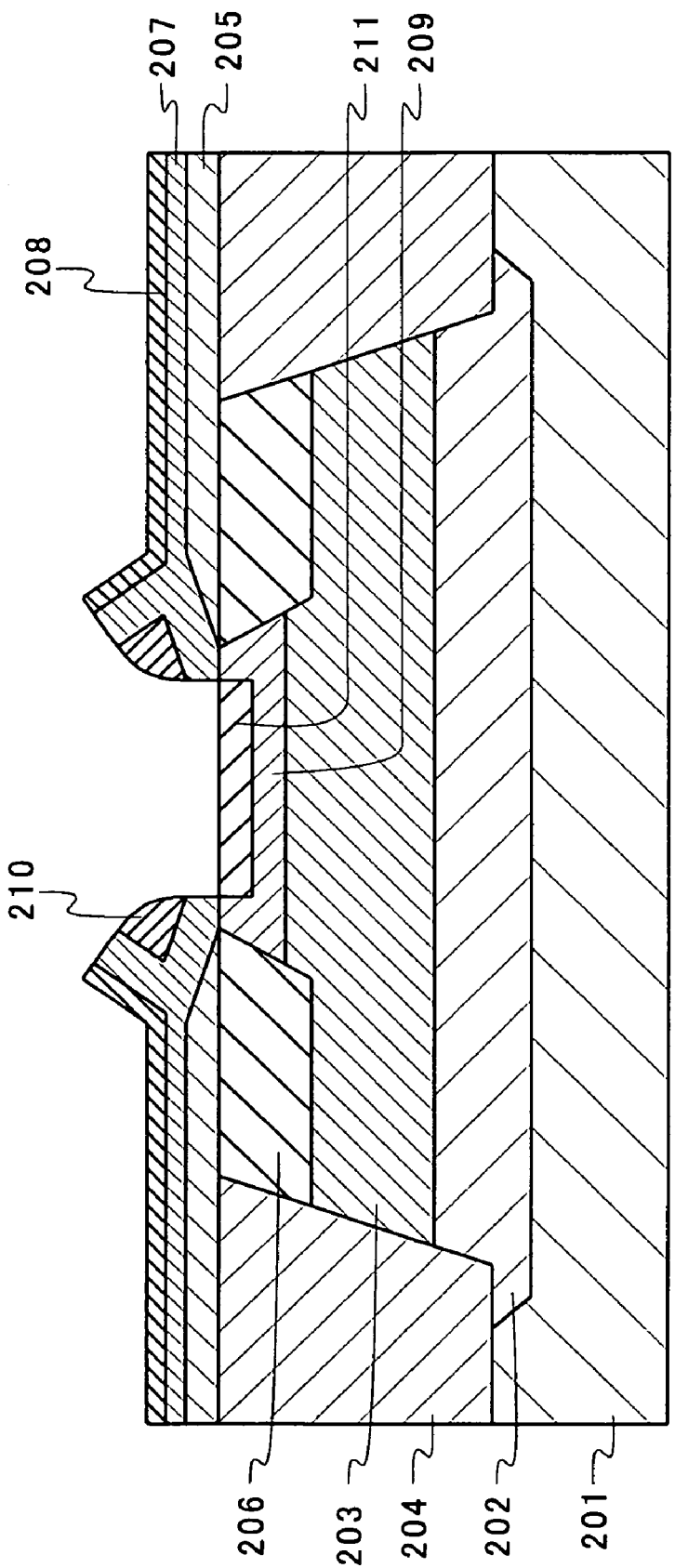
FIG. 15B is a cross sectional view showing a manufacturing process of the bipolar transistor disclosed in Japanese Unexamined Patent Application Publication No. 6-53229.
Figure 15C:
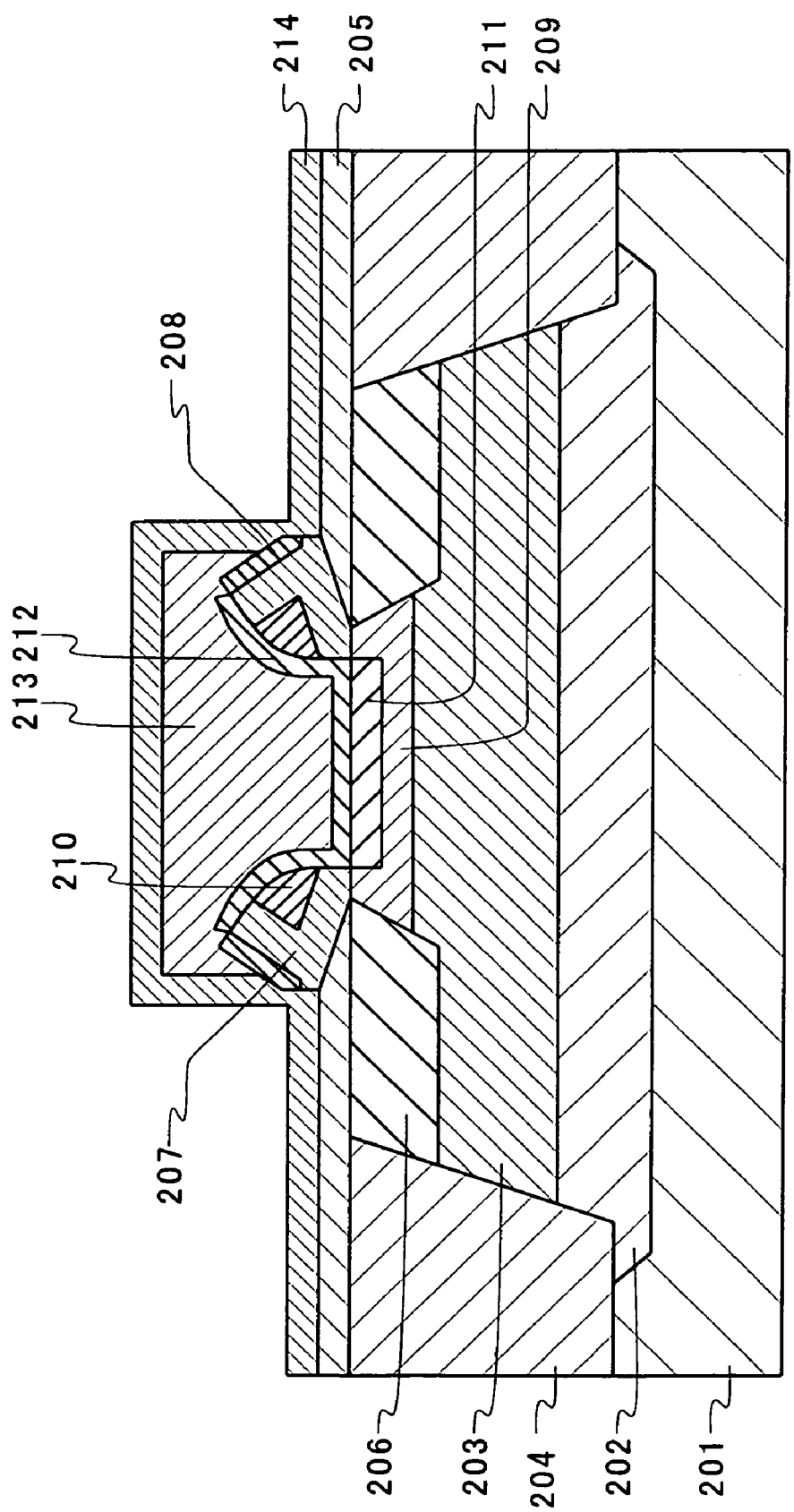
FIG. 15C is a cross sectional view showing a manufacturing process of the bipolar transistor disclosed in Japanese Unexamined Patent Application Publication No. 6-53229.

Now, the structure of a bipolar transistor according to the third exemplary embodiment will be described. FIG. 11 is a cross sectional view of the bipolar transistor according to the third exemplary embodiment. This bipolar transistor is formed on an $N^+$ silicon substrate 1b, as shown in FIG. 11. On the $N^+$ silicon substrate 1b, an $N^-$ epitaxial growth layer 3b is formed. Further, in the bipolar transistor, the collector part is not formed, and thus the collector electrode 36c is not included.

In this bipolar transistor, the $N^+$ silicon substrate 1b in the lower surface side is used as the collector electrode instead of using the collector electrode 36c. Although not shown in the drawings, the thickness of the $N^+$ silicon substrate 1b is reduced by thinning it, and thereafter a metal is deposited. For example, the metal that is deposited may be a single layer of Au, Ti, Ni, Ag or the like, or may have a multi-layer structure obtained by combining them. The other structures are similar to those shown in FIG. 1, and thus description will be omitted.

Hence, according to this structure, as is similar to the bipolar transistor shown in FIG. 1, it is possible to obtain the bipolar transistor having high reliability that makes it possible to reduce variation of hFE and prevent the increase of the resistance.

Further, according to this structure, the collector part is not formed, whereby the chip area of the bipolar transistor can be reduced. Accordingly, it is possible to increase the chip yield for one wafer. Further, as this bipolar transistor can be embedded into an ultra-small-outline package, thereby reducing size of electrical products.

Note that the present invention is not limited to the above-described exemplary embodiments but can be changed as appropriate without departing from the spirit of the present invention. For example, P and N may be switched.

The semiconductor substrate is not limited to silicon, but other semiconductor materials such as Ge, SiGe, GaN, GaAs, SiC, InP or the like may be used, for example.

The insulating material is not limited to oxide silicon and nitride silicon, but other insulating materials such as silicon oxynitride or the like may be used, for example.

Note that a C doped SiGe: C layer may be used as the B-doped SiGe layer 17, for example. In this case, the high-frequency property can be enhanced.

Alternatively, a B doped Si layer may be used as the B-doped SiGe layer 17, for example. In this case, hFE variation can be reduced compared with a case of implanting B by the typical ion implantation method.

Further, the present invention can be applied not only to the the self-aligned bipolar transistor shown in FIG. 1 but also to a non self-aligned bipolar transistor. By applying the present invention to the non self-aligned bipolar transistor, simpler structure can be realized, thereby reducing the manufacturing process and the manufacturing cost.

The N$^+$ polysilicon layer 21*a* shown in FIG. 2G may be formed by depositing polysilicon while doping P instead of As. Further, polysilicon that does not include impurities may be deposited, thereafter N impurities such as As or P are introduced by ion implantation, so as to form the N$^+$ polysilicon layer 21*a*.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A bipolar transistor comprising:
    a semiconductor substrate that includes an epitaxial growth layer;
    a polysilicon layer that is formed on the semiconductor substrate;
    a conductive first protection layer that covers the polysilicon layer;
    a metal layer that is formed on the conductive first protection layer;
    a conductive second protection layer that covers the metal layer; and
    an emitter electrode that is formed on the conductive second protection layer.

2. The bipolar transistor according to claim 1, further comprising:
    an insulation layer that contacts with the semiconductor substrate; and
    a base electrode that is formed on the insulation layer.

3. The bipolar transistor according to claim 2, wherein a parasitic capacitance is determined according to a thickness of the insulation layer.

4. The bipolar transistor according to claim 2, wherein the insulation layer is formed of a BPSG.

5. The bipolar transistor according to claim 1, further comprising an element isolation zone that is formed in the semiconductor substrate.

6. The bipolar transistor according to claim 1, wherein the semiconductor substrate is a collector electrode.

7. The bipolar transistor according to claim 1, wherein the conductive first protection layer and the conductive second protection layer are formed of silicide.

8. The bipolar transistor according to claim 1, wherein the metal layer is formed of tungsten.

9. The bipolar transistor according to claim 1; wherein a thickness Y1 of the polysilicon layer satisfies 100 nm<Y1<320 nm.

10. The bipolar transistor according to claim 1, wherein N impurities are introduced into the polysilicon layer.

11. The bipolar transistor according to claim 1, wherein the semiconductor substrate is formed of silicon.

* * * * *